United States Patent [19]

Amemiya et al.

[11] Patent Number: 5,606,586
[45] Date of Patent: Feb. 25, 1997

[54] X-RAY EXPOSURE METHOD AND APPARATUS AND DEVICE MANUFACTURING METHOD

[75] Inventors: Mitsuaki Amemiya, Isehara; Yasuaki Fukuda, Hadano; Yutaka Watanabe; Akira Miyake, both of Isehara, all of Japan

[73] Assignee: Canon Kabushiki Kaisha, Tokyo, Japan

[21] Appl. No.: 678,784

[22] Filed: Jul. 11, 1996

Related U.S. Application Data

[63] Continuation of Ser. No. 120,341, Sep. 14, 1993, abandoned.

[30] Foreign Application Priority Data

Sep. 14, 1992 [JP] Japan .................................. 4-270973
Jun. 29, 1993 [JP] Japan .................................. 5-159495
Jun. 30, 1993 [JP] Japan .................................. 5-161789

[51] Int. Cl.⁶ ........................................................ G21K 5/00
[52] U.S. Cl. ............................................... 378/34; 378/145
[58] Field of Search ................................ 378/34, 35, 145, 378/146, 151

[56] References Cited

U.S. PATENT DOCUMENTS

| | | | |
|---|---|---|---|
| 5,123,036 | 6/1992 | Uno et al. | 378/34 |
| 5,285,488 | 2/1994 | Watanabe et al. | 378/34 |

FOREIGN PATENT DOCUMENTS

| | | |
|---|---|---|
| 0345097 | 12/1989 | European Pat. Off. . |
| 0357425 | 3/1990 | European Pat. Off. . |
| 0416811 | 3/1991 | European Pat. Off. . |
| 01243519 | 9/1989 | Japan . |
| 05129188 | 5/1993 | Japan . |

OTHER PUBLICATIONS

Laundy, "Electron Beam Measurements on the Daresbury SRS," Rev. Sci. Instrum., vol. 63, No. 1, Jan. 1992, pp. 554 through 556.

Patent Abstracts of Japan, Kokai No. 04-043626, vol. 16, No. 230, May 1992.

*Primary Examiner*—Don Wong
*Attorney, Agent, or Firm*—Fitzpatrick, Cella, Harper & Scinto

[57] ABSTRACT

An exposure method using X-rays from a synchrotron radiation source includes determining a relationship between an X-ray intensity distribution and an exposure amount distribution in an exposure area; and effecting exposure operation while controlling a dose amount for respective positions in the exposure area using the relationship, wherein the dose amount is controlled by changing a driving profile of a movable shutter for controlling the exposure operation, and wherein the relationship is in the form of a proportional coefficient between an X-ray intensity and the exposure amount as a function of position information in the exposure area.

11 Claims, 27 Drawing Sheets

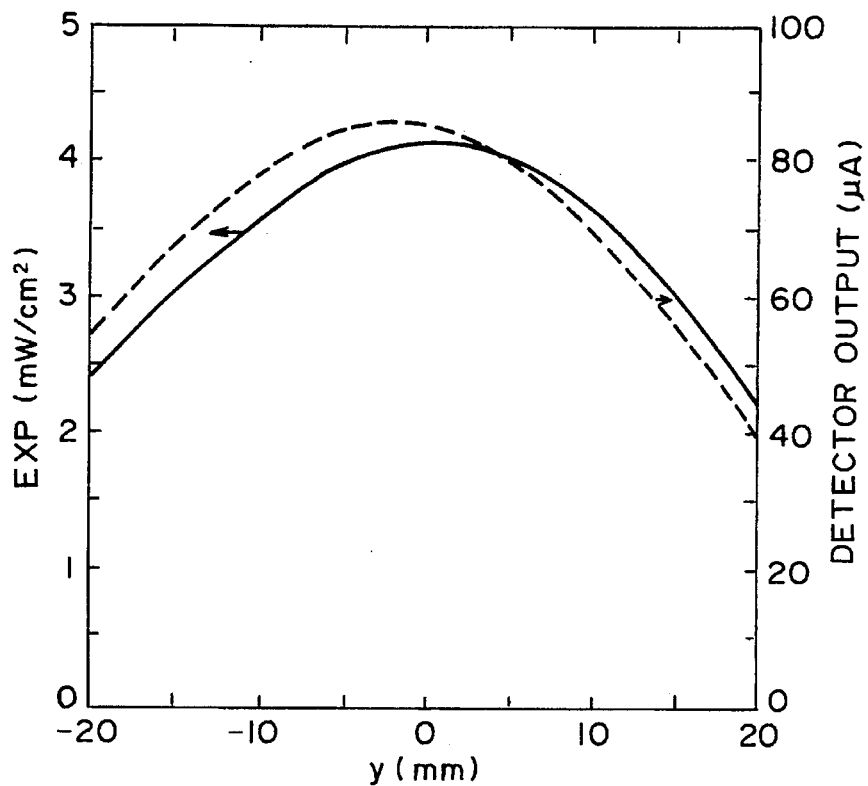
F I G. 9
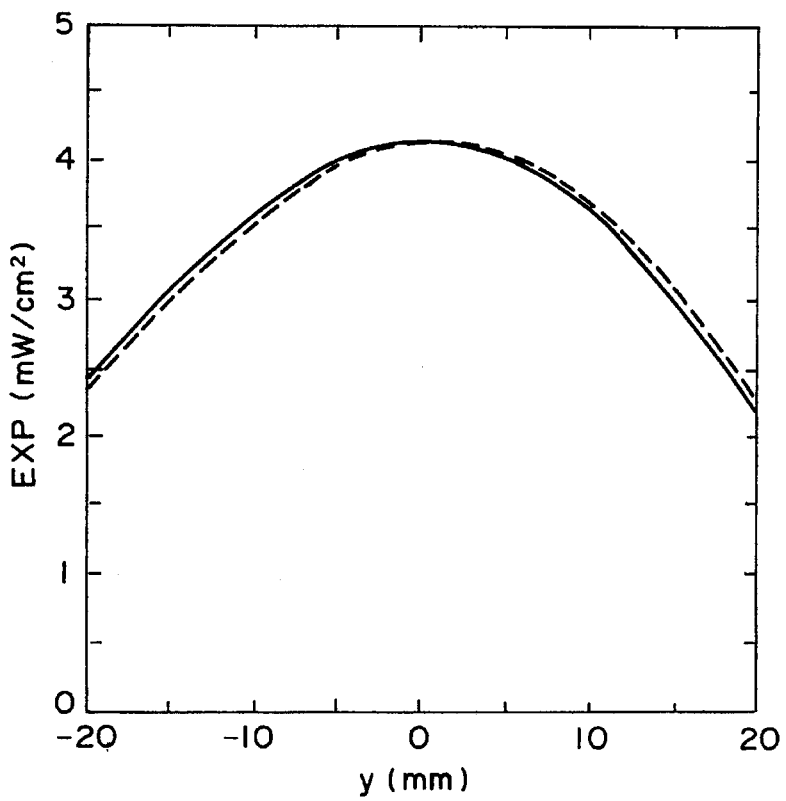
F I G. 10

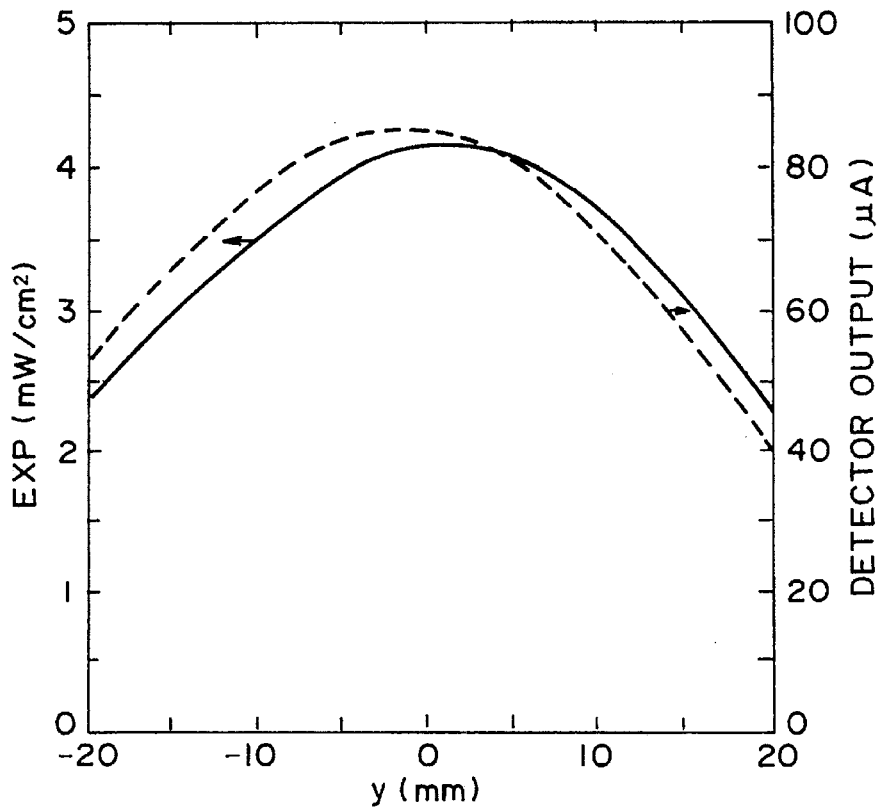
F I G. 13
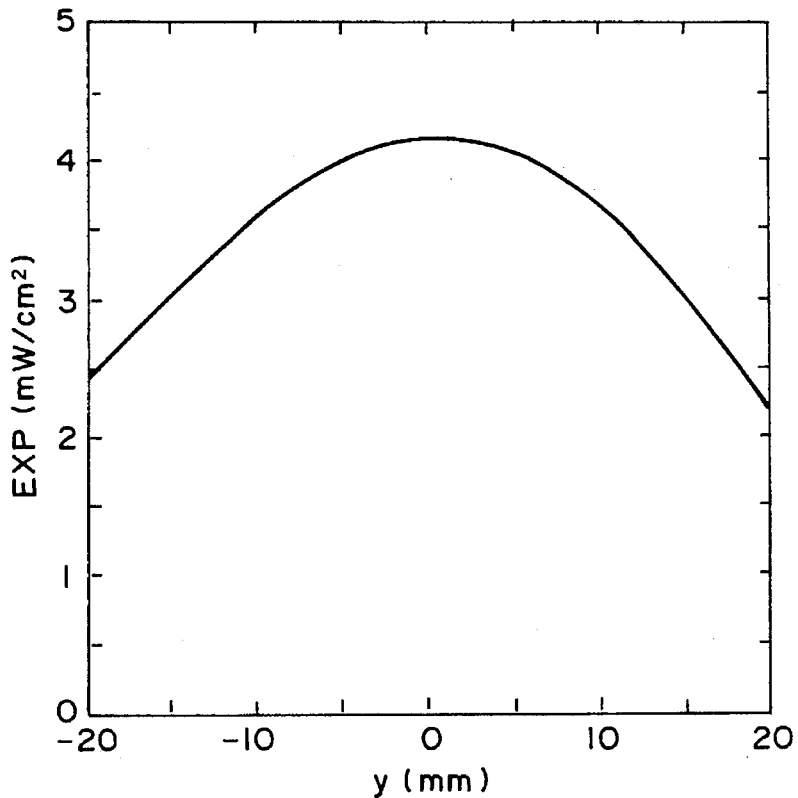
F I G. 14

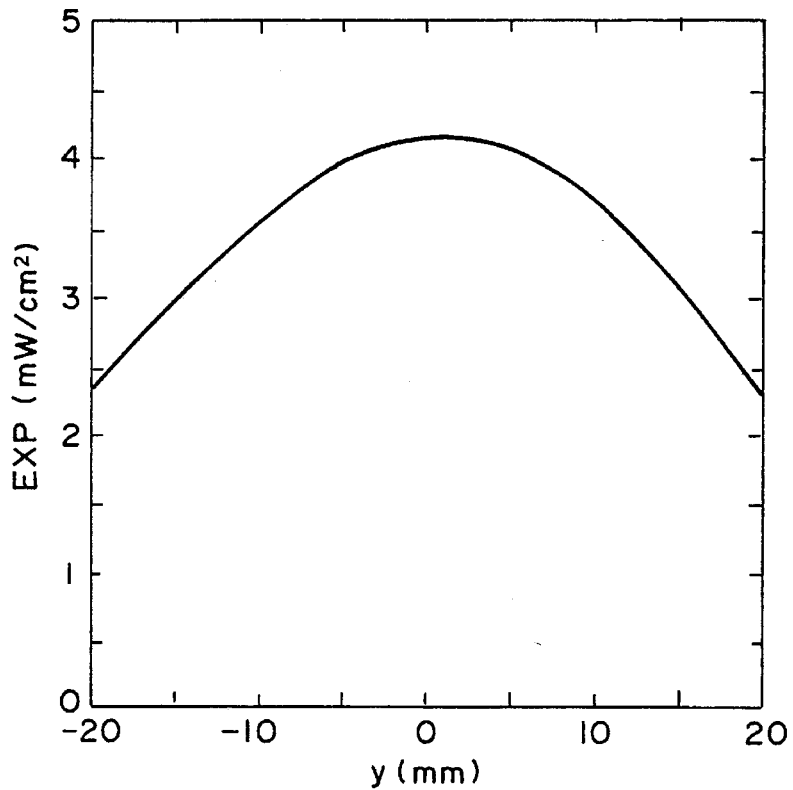
F I G. 15
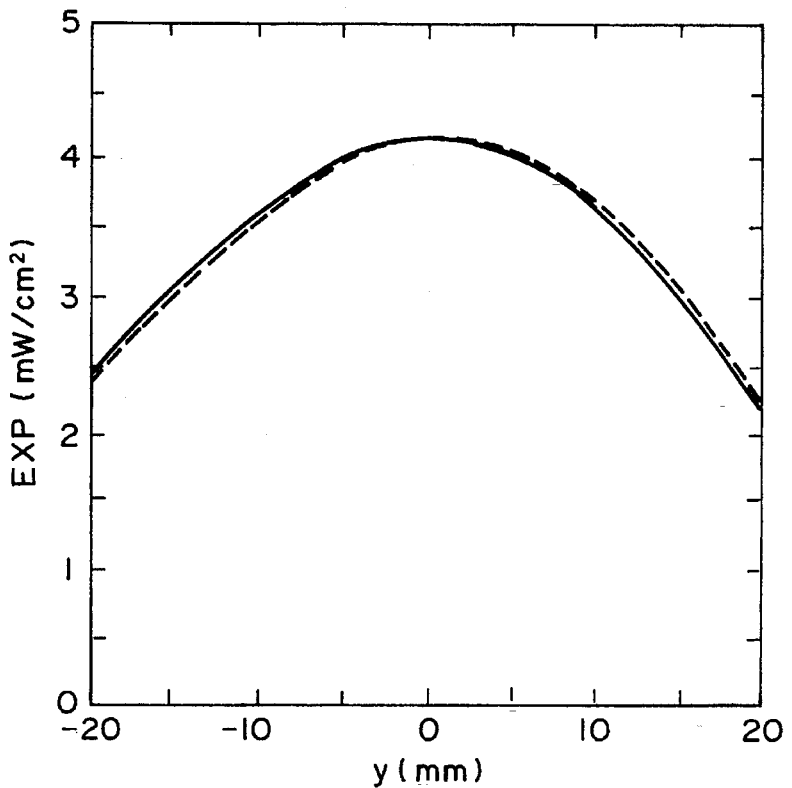
F I G. 16

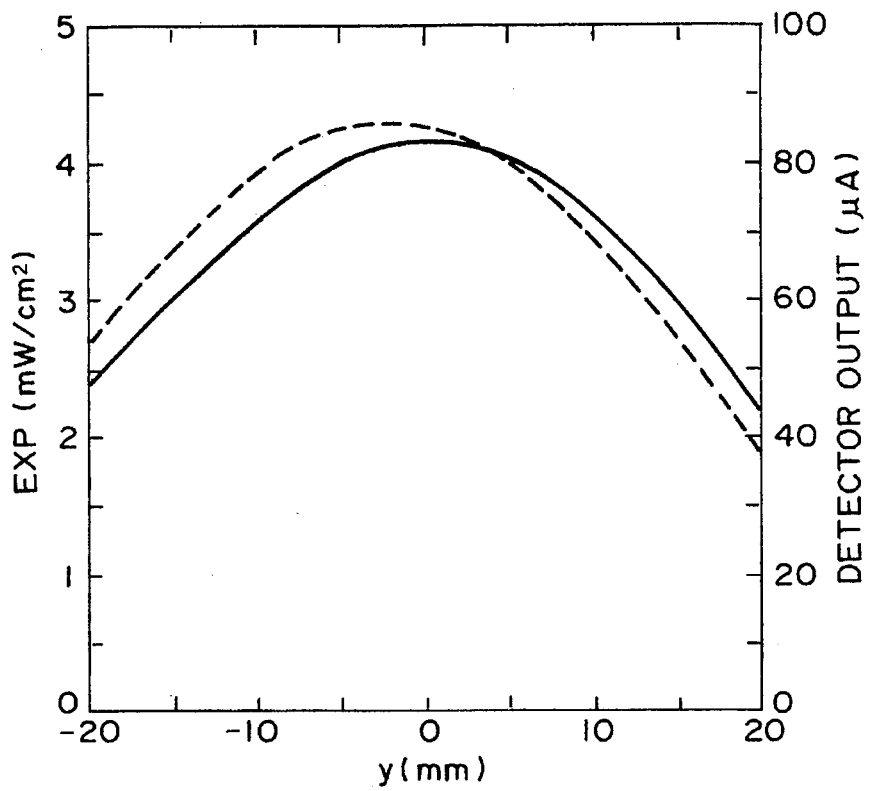
F I G. 17
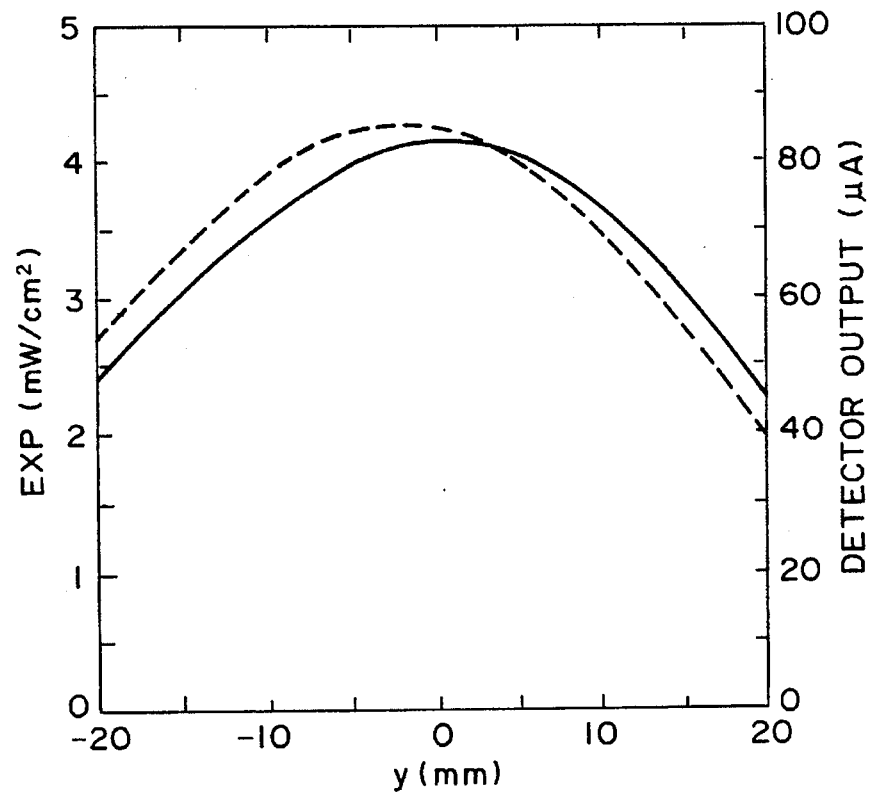
F I G. 18

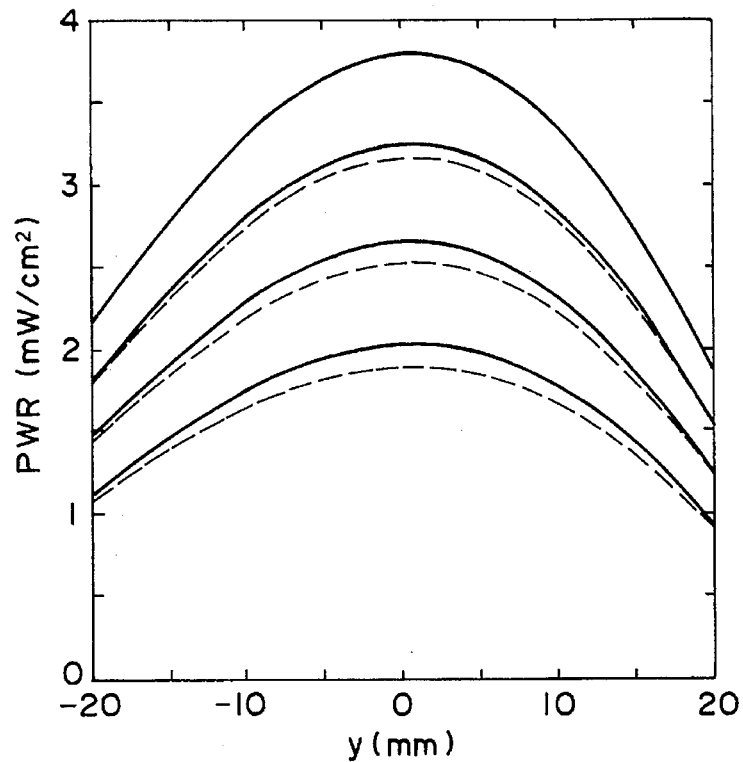
F I G. 33
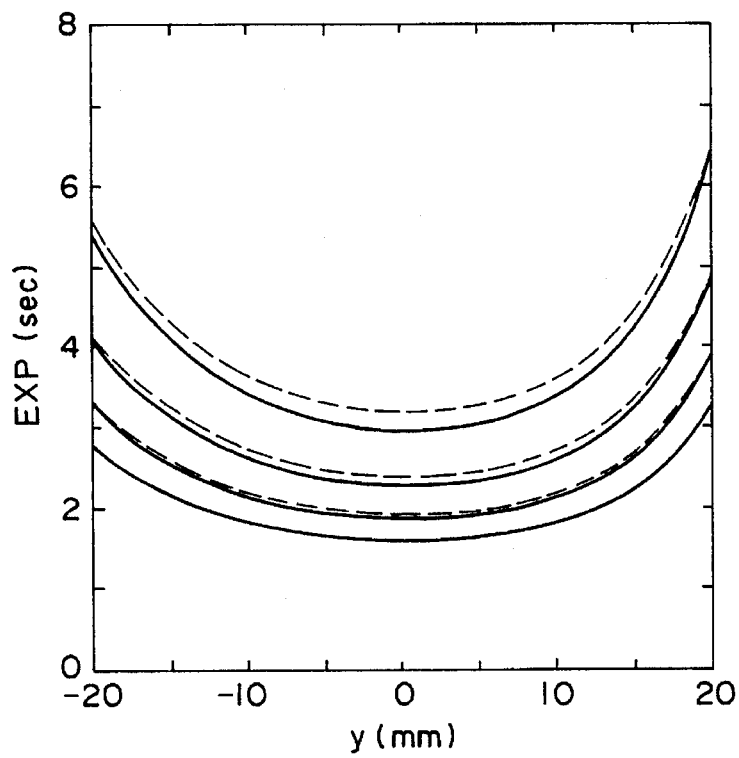
F I G. 34

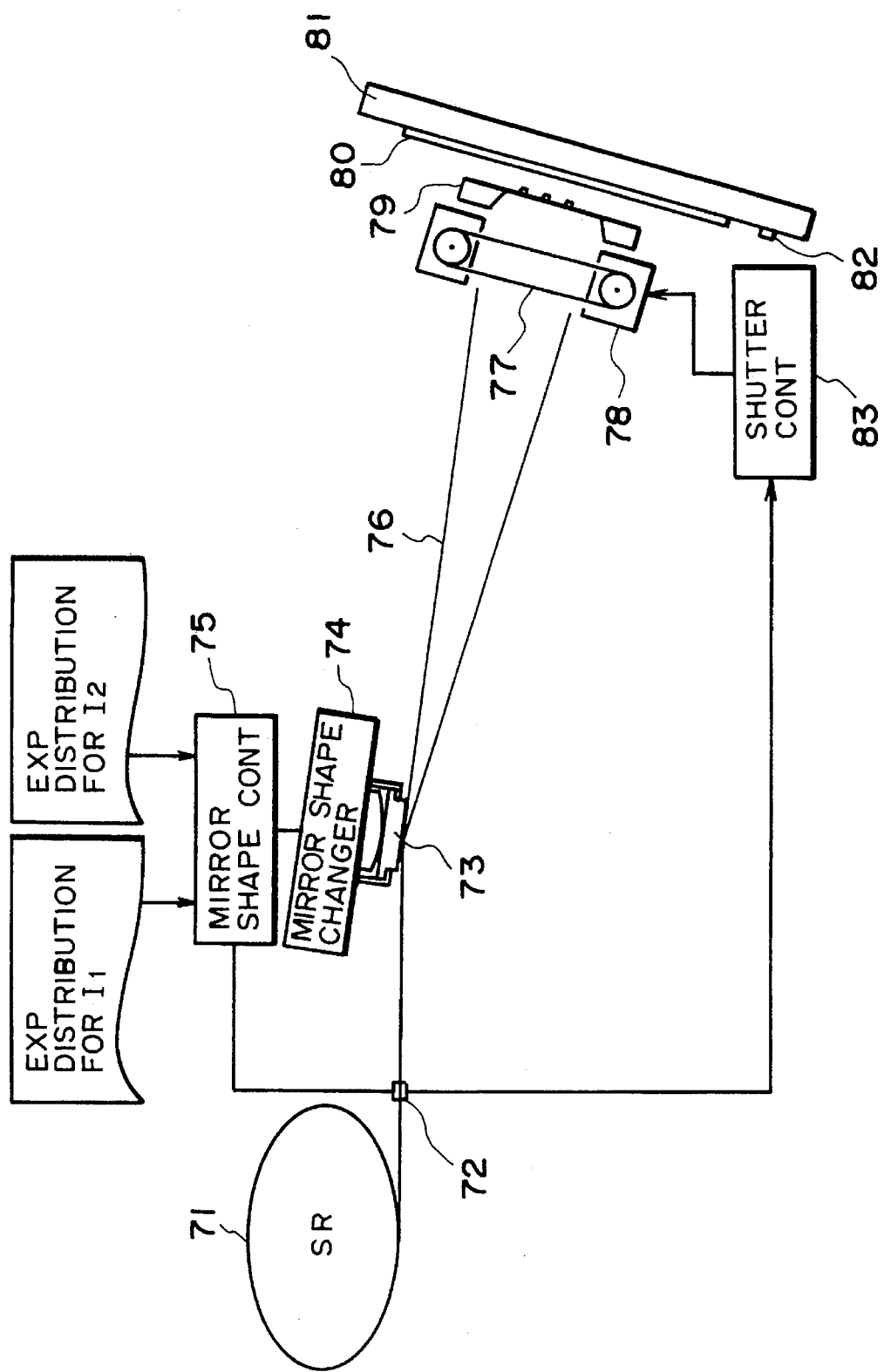
F I G. 36

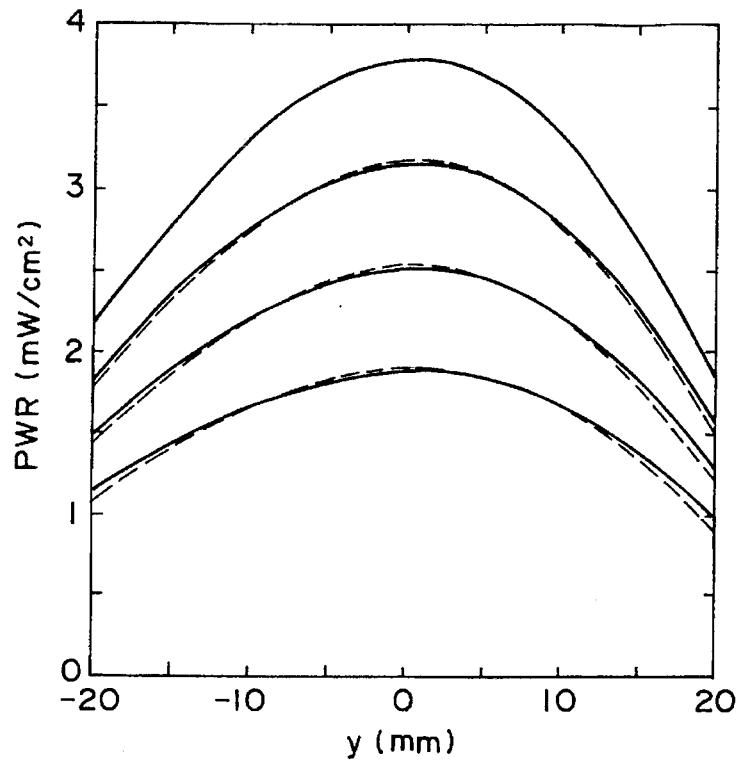
F I G. 37
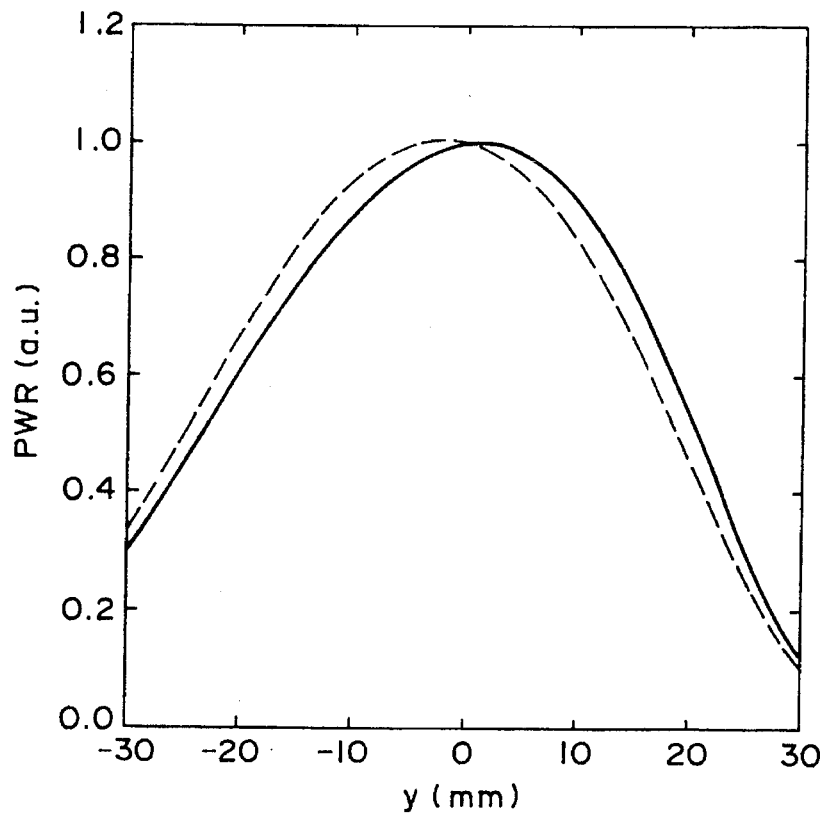
F I G. 38

X-RAY EXPOSURE METHOD AND APPARATUS AND DEVICE MANUFACTURING METHOD

This application is a continuation of application No. 08/120,341, filed Sep. 14, 1993, now abandoned.

FIELD OF THE INVENTION AND RELATED ART

The present invention relates to an exposure method and an X-ray exposure apparatus and a device manufacturing method in which a substrate such as a wafer is exposed to X-ray radiation (light).

Recently, an X-ray exposure apparatus is under development in which rays from a charged particle accumulating ring, which will hereinafter be called "SR-X-rays" are used as illumination energy to expose the wafer or another substrate (which will hereinafter be called a "substrate"). Generally, a divergence angle of SR-X-rays is small in a direction perpendicular to an orbit plane of the charged particle accumulation ring, which will hereinafter be called a "y-axis direction", and therefore, a convex mirror is disposed in a path of the rays (optical path) from the point of radiation of the charged particle accumulation ring to increase the divergence in the y-axis direction. The X-ray intensity of the SR-X-rays which has been enlarged in the y-axis direction by the mirror is uniform in the direction perpendicular to the y-axis direction, which will hereinafter be called an "x-axis direction", but it has a curved distribution indicated by a solid line in FIG. 2 in the y-axis direction. For this reason, a shutter is disposed between the mirror and the substrate to control the exposure period so as to provide a uniform exposure amount of the surface of the substrate.

Referring to FIG. 1, there is shown an example of an X-ray exposure apparatus using the convex mirror. The SR-X-rays L in the form of a sheet generated from the point of radiation 101 of the charged particle accumulation ring are expanded in the y-axis direction by a mirror 102 having a convex reflecting surface. The X-rays are introduced into an unshown reduced pressure chamber through an X-ray transmitting film 103, and are incident on a substrate 105 supported on a substrate stage 104, through an opening of the shutter 107. Adjacent the surface of the substrate 105, a mask having a pattern opening (not shown) is disposed. At an upper end of the shown substrate stage 104, an X-ray detector 106 is disposed. Before the start of the exposure of the substrate 105, the substrate stage 104 is moved downwardly in the Figure, and the X-ray detector 106 detects the X-ray intensity distribution in the exposure area. The exposure period at each position in the y-axis direction is controlled by the shutter 107 so as to be reversely proportional to the X-ray intensity distribution determined by the X-ray detector 106.

SUMMARY OF THE INVENTION

The radiation from the charged particle accumulation ring has a continuous spectrum from X-rays of a wavelength of several tens of pm to infrared rays. In the X-ray exposure apparatus, the radiated rays are reflected by at least one mirror, and are transmitted through a Be window functioning as a vacuum isolator. They are then reflected by or transmitted through a mask, and then are absorbed by a resist. The component having a wavelength longer than several nm is reflected or absorbed by the Be window. The short wavelength component of approximately 0.5 nm or shorter is not reflected by the mirror, and therefore, is absorbed by the resist. The component to which the resist is exposed has approximately 1 nm wavelength. Strictly speaking, however, the spectrum distribution of the radiation is different depending on the angle formed with the SR orbit plane, and the reflectance is different depending on the incident angle to the mirror and the wavelength. Therefore, the spectral distribution of the rays reaching to each point in the exposure region is different depending on the type of rays.

The energy effect to expose the resist is not the energy per unit area incident on the resist, but the energy per unit area absorbed by the resist. In the case of soft X-rays (hereinafter soft X-rays are included in the class of X-rays) of 1 nm approx., the ratio of the X-ray energy per unit area incident on the resist to the X-ray energy per unit area absorbed by the resist changes significantly, even if the wavelength change is small. For this reason, the measurement of the energy distribution of the X-rays given to the resist in the exposure area does not necessarily mean the measurement of the distribution of the exposure intensity of the resist. In addition, a detector for detecting X-ray intensity has a different sensitivity depending on the difference of the wavelength (this is said to be that a spectral sensitivity is different). The X-ray intensity distribution detected by an X-ray detector is generally different from the intensity distribution of the X-rays per unit area incident on the resist.

The exposure intensity distribution is a distribution of the exposure amount in the exposed area, and is reversely proportional to the time period required for the optimum exposure. The exposure intensity is considered as being proportional to the energy per unit area absorbed by the resist. When the material of the resist is different, exposure intensity distribution may change. In addition, even if the material of the resist is the same, exposure intensity distribution may change if the thickness is changed. As for the method of determining the exposure intensity distribution, there is a method in which an exposure area is exposed for a predetermined period under fixed process conditions, and the remaining resist film ratio is measured at each point in the exposure area, a method in which an accuracy of a line width of the resist is detected relative to the line width of the mask, a method in which a resist profile is measured, or the like. The amount of exposure is defined as the intensity of exposure radiation multiplied by the time period of exposure at the point. It is called an optimum exposure amount when the time period of the exposure is the same as the time period required for the optimum exposure. Exposure amount nonuniformity means deviation from an optimum exposure amount, or it means an amount of deviation. It is caused by a variation of the exposure intensity and the exposure period. In the X-ray exposure apparatus, the tolerable exposure amount nonuniformity is approx. 2%. Of the tolerable nonuniformity, the error permitted to the measurement of the exposure intensity is approx. 0.5%.

According to the method in which the exposure intensity distribution is detected, it is obtained only after the exposure operation is actually carried out. The problem thereof is that the exposure intensity distribution changes by the change in the relative positional relationship among the point of radiation, at least one mirror, the mask and the wafer. The change of the accumulation current in the SR generating apparatus results in a change in $\sigma y$, $\sigma y'$ of the electron beam of the SR generating apparatus, and therefore, the change in the exposure intensity distribution. It is cumbersome to detect the exposure intensity distribution for each of such changes, and it is difficult to specify the change among various changes.

Thus, the problem of the reduction of yield attributable to the exposure amount nonuniformity arises. For this reason, a method of measuring the exposure intensity distribution in a short period of time and with the accuracy corresponding to the tolerable exposure non-uniformity is necessary.

Accordingly, it is a principal object of the present invention to provide an X-ray exposure apparatus, an X-ray exposure method and a device manufacturing method using the same in which the exposure intensity distribution can be quickly detected with the accuracy corresponding to the tolerable exposure non-uniformity.

The recent investigations have revealed that there is a shape instability of the SR light stemming from the SR radiation itself, as well as the position instability of the electron beam from the point of radiation of the radiation source and the position instability of the exposure position attributable to an angle instability of the X-rays from the point of radiation.

The shape of the electron beam and the angular component of the velocity are both in the form of a Gaussian distribution or close thereto, and are expressed by:

$$f(y,y')dydy' = \frac{1}{2\pi\sigma_y \sigma_{y'} \sqrt{1-\xi_y^2}} \exp\left(-\frac{(y-y_0)^2}{2\sigma_y^2} - \frac{\left(y' - \xi_y \frac{\sigma_{y'}}{\sigma_y} y - y_0'\right)^2}{2\sigma_{y'}^2(1-\xi_y^2)}\right) dydy' \quad (A)$$

where y is a position in a direction perpendicular to the SR orbit plane of the electrons in the electron beam, and y' is an angular component perpendicular to the SR orbit plane of the velocity of the electrons in the electron beam.

By the positional instability of the SR radiation, that is, by the changes of $Y_0$ and $y'_0$ in equation (A), the angle of incidence to the mirror changes (the change in the incident position on the mirror causes the change in the incident angle to the mirror), and the reflectance of the SR radiation changes due to the change of the angle of incidence significantly. As a result, the shape of the reflected radiation from the mirror changes. This has been known. In consideration, as disclosed in Japanese Laid-Open Patent Application No. 129188/1993, an X-ray detector is disposed before the mirror, and the output thereof is fed back, so that the position of incidence of the SR radiation on the mirror is stabilized.

The shape instability of the SR radiation attributable to the SR source itself can occur due to the changes of the σy and σy', and is the instability by nature even if no mirror is used. It is a cause of exposure non-uniformity.

The shape instability of the SR radiation is dealt with in D. Laundy and S Cummings, "Electron Beam 63, Measurements on the Daresbury SRS, "Rev. Sci Instrum 63, January 1992, p. 554–556, together with the results of experiments.

It is another object of the present invention to provide an X-ray exposure method and apparatus and a device manufacturing apparatus in which the exposure non-uniformity attributable to the shape instability of SR radiation stemming from the variation in the accumulation current can be reduced.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 9 is a graph of the exposure amount intensity distribution and an X-ray detector disposed on a wafer stage.

FIG. 10 is a graph of an exposure intensity distribution when the position of the mirror changes in the y direction.

FIG. 13 is a graph of the exposure intensity distribution and an X-ray detector output when the position of the mirror changes in the y direction by 50 μm.

FIG. 14 is a graph of an exposure intensity distribution D1 (y) and D1' (y) when the position of the mirror changes in the y direction by 10 μm.

FIG. 15 is a graph of an exposure intensity distribution D1 (y) and D1' (y) when the position of the mirror changes in the y direction by 50 μm.

FIG. 16 is a graph of an exposure intensity distribution when a mirror rotates about the x-axis by 10 μrad and 50 μrad.

FIG. 17 is a graph of an exposure intensity distribution and an X-ray detector output when a mirror rotates through 10 μrad.

FIG. 18 is a graph of an exposure intensity distribution and an X-ray detector output when a mirror rotates through 50 μrad.

FIG. 33 is a graph of energy which is absorbed by a unit area of a resist from SR radiation emitted from the typical SR exhibiting the dependencies shown in FIGS. 31 and 32.

FIG. 34 is a graph of an optimum exposure period at each point in an exposure area.

FIG. 36 illustrates an X-ray exposure apparatus according to a sixth embodiment of the present invention.

FIG. 37 is a graph of an exposure intensity distribution of an X-ray exposure apparatus according to the sixth embodiment of the present invention.

FIG. 38 is a graph of a normalized X-ray intensity distribution measured using an exposure intensity distribution and an X-ray detector.

DESCRIPTION OF THE PREFERRED EMBODIMENTS

Embodiment 1

The first embodiment will be described.

Figure 1:
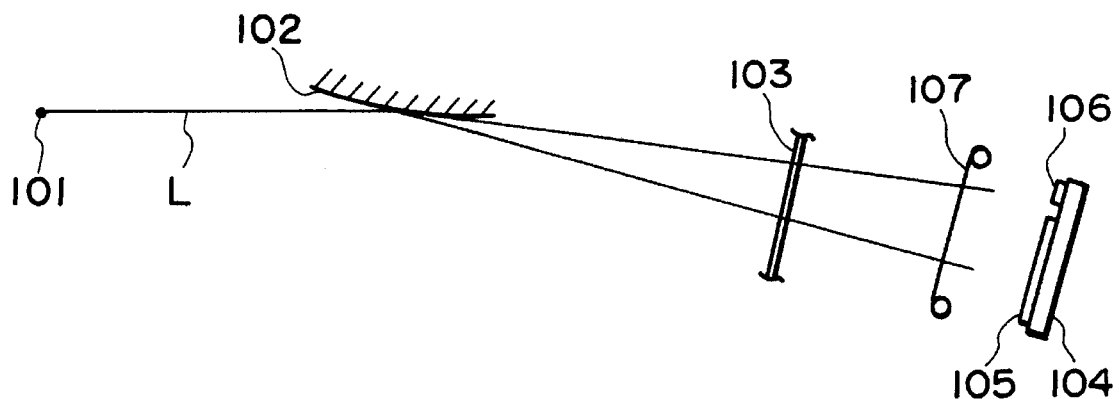
FIG. 1 illustrates a conventional X-ray exposure apparatus having a convex mirror.
Figure 2:
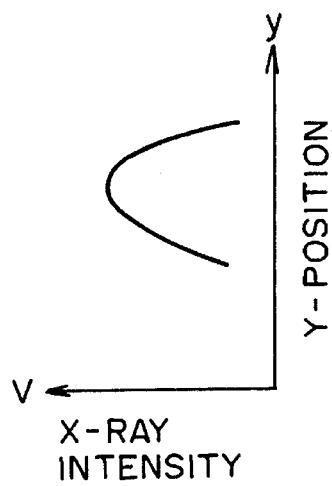
FIG. 2 shows an X-ray intensity distribution.
Figure 3:
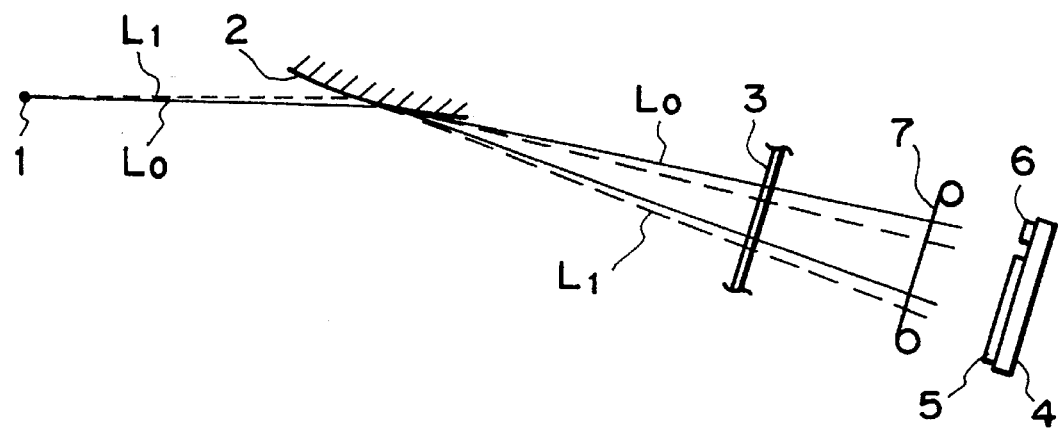
FIG. 3 illustrates an optical path of SR-X-rays in an exposure apparatus employing a convex mirror.

FIG. 3 shows an X-ray exposure apparatus using a convex mirror, and more particularly, a situation in which an SR-X-ray L0 which is an X-ray radiation ray along an optical path indicated by a solid line when an exposure operation is started, changes to SR-X-ray L1 along an optical path indicated by broken lines after the exposure is interrupted and orbit electrons are injected.

The SR-X-rays L0 and L1 are emitted from a point of emission 1 of the charged particle accumulation ring and are enlarged in a y-axis direction perpendicular to an orbit plane of the charged particle accumulation ring by a convex mirror 2. Then, the X-rays are introduced into a pressure-reduced chamber not shown through an X-ray transmitting film, and are incident on a substrate 5 supported on a substrate stage 4. At the upper end of the substrate stage 4 shown in the Figure, an X-ray detector 6 is disposed, and a shutter 7 for controlling the exposure period is disposed between the X-ray transmitting film 3 and the substrate stage 4.

Figure 4A:
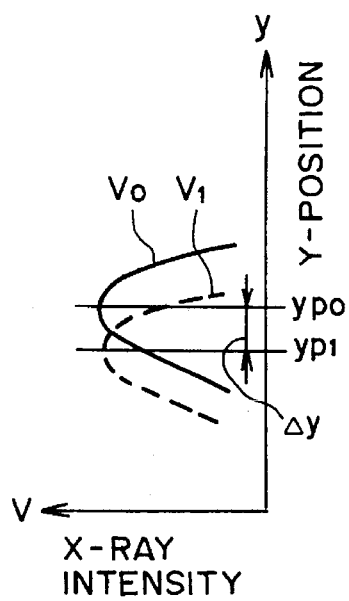
FIGS. 4A and 4B show an X-ray intensity distribution and an exposure intensity distribution, which varies depending on the change of the optical path of the SR-X-rays.

Before the start of the exposure, the substrate stage 4 is moved downwardly in the Figure, and an X-ray intensity distribution V0 (y), in the y-axis direction, of the SR-X-ray L0 (the solid line in FIG. 4A) is measured by an X-ray detector 6.

Since an output Vx (y, t) of the X-ray detector 6 changes in proportion to an orbit current I(t), it is normalized (I(t)) so that the X-ray intensity distribution V(y) is constant relative to time, as follows:

$$V(y)=Vx(y, t)/I(t).$$

The orbit current I(t) is measured by an ammeter such as a DCCT (not shown) in the charged particle accumulation ring.

Figure 4B:
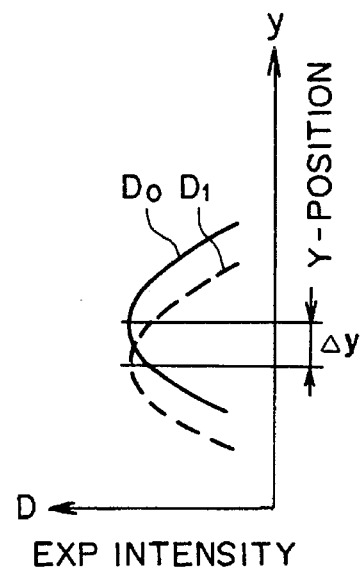

Subsequently, the substrate 5 is exposed, and the resist is processed, and then, the distribution of the exposure amount is calculated on the basis of the remaining film ratio of the resist and a resist characteristics curve predetermined. On the basis of that, the exposure intensity distribution D0 (y, t$_0$) (the solid line in FIG. 4B) is determined. In addition, by an ammeter such as a DCCT or the like, an initial orbit current I(t$_0$) of the charged particle accumulating ring 1 is measured.

Then, the exposure period t$_{exp}$ at the time t during the exposure and at an exposure position y by the following equation (1), and on the basis of this, a moving speed curve of a shutter 7 is set, and the mask pattern is printed on a substrate 5 for a semiconductor device.

$$t_{exp}(y, t) = \frac{I(t_0)}{I(t)} \cdot \frac{C_0}{D_0(y, t_0)} \quad (1)$$

where, I(t) is an orbit current of the charged particle accumulating ring measured at the time t, and C$_0$ is a constant on the basis of a set exposure amount.

The orbit current I(t) of the charged particle accumulating ring at the time t may be measured by a known ammeter such as a DCCT or the like as with the initial orbit current I(t$_0$). Alternatively, an X-ray sensor is disposed adjacent to the shutter 7, and it may be determined from a variation of the output thereof.

When the orbit electrons of the charged particle accumulation ring reduce, re-injection is carried out. Then, the optical path of the SR-X-ray may change due to a change of the point of emission 1 of the charged particle accumulation ring and/or a radiation angle of the SR-X-ray. If this occurs, the exposure intensity distribution D1 (t$_1$) of the changed SR-X-ray L1 is estimated in the following manner, and the moving speed curve of the movable shutter 7 is corrected on the basis thereof.

First, the substrate stage 4 is moved down in the Figure, and the X-ray intensity distribution V1 (y) of the changed SR-X-ray L1 (indicated by a broken line in FIG. 4A) is measured by an X-ray detector 6. Then, a difference Δy between a peak position $Y_{p0}$ of the X-ray intensity distribution V0 of the SR-X-ray L0 upon a start of the exposure and a peak position $Y_{p1}$ of the X-ray intensity distribution V1 of the changed SR-X-ray L1 is determined. The exposure intensity distribution D1 (y, $t_1$) of the changed SR-X-ray L1 (indicated by a broken line in FIG. 4A) is estimated as follows:

$$D_1(y, t_1) = \frac{I(t_1)}{I(t_0)} D_0(y - \Delta y, t_0) \quad (2)$$

Thus, the change in the exposure intensity distribution due to the change of the optical path of the SR-X-ray is deemed as being derived from the same positional deviation which is the same as the positional deviation ay of the X-ray intensity distribution.

Using the equations (1) and (2), the exposure period $t_{1exp}$ after the change is determined by the following equation (3), and the shutter 7 moving speed curve is corrected thereby:

$$t_{1exp}(y, t_1) = \frac{I(t_0)}{I(t)} \cdot \frac{C_0}{D_0(y - \Delta y, t_0)} \quad (3)$$

In place of correcting the shutter 7 moving speed curve, the substrate stage 4 may be shifted by $-\Delta y$.

An example of a calculation will be described.

Figure 5:
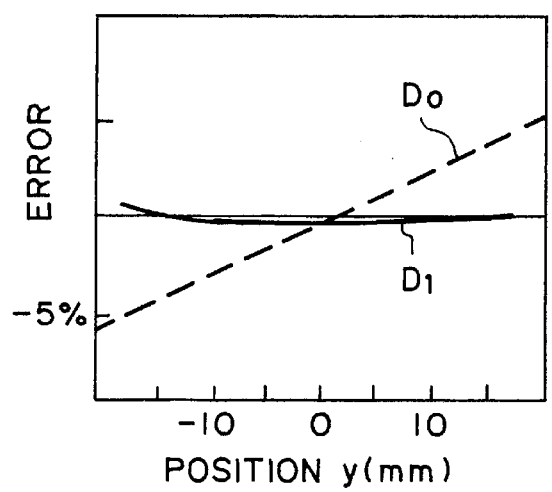
FIG. 5 shows an error of exposure intensity distribution estimated according to the present invention relative to the exposure intensity distribution determined by test printing.

An X-ray exposure apparatus is taken in which an orbit radius of the charged particle accumulation ring is 0.6 m; and an accelerating voltage is 800 MV; a radius of the mirror is 50 m; a reflection angle is 15 mrad; a distance between the point of emission of the charged particle accumulation ring and the mirror is 7 m; a distance between the mirror and the X-ray transmitting film is 4 m; a distance between the X-ray transmitting film and the substrate is 0.8 mm; the resist material is PMMA; the mask material is SiN; an X-ray detector is GaAs; and the exposure area is ±15 mm. When a radiation angle of the SR-X-ray is changed by 0.01 mrad as a result of the orbit electron injection into the charged particle accumulation ring, the X-ray intensity distribution V1 (y, $t_1$) is detected by the X-ray detector. Several plots of the measurements adjacent the peak are approximated by a quadratic equation curve, and the peak position is determined using the least square approximation. The comparison is made with the peak position of the X-ray intensity distribution V0 measured before the start of the exposure, and the positional deviation Ay is determined. Using equation (2), the exposure intensity distribution D1 (y, $t_1$) is estimated by equation (2). The actual exposure intensity distribution is determined on the basis of the actual printing on the substrate, and the error therefrom is as shown in FIG. 5 and is not more than ±0.2%.

The broken line shows an error of the exposure intensity distribution DO (y, $t_0$) measured by the actual printing before the exposure start relative to the exposure intensity distribution measured by the actual printing after the orbit electron injection. The average is ±4%.

As another method of calculating the positional deviation $\Delta y$ of the peak position in the X-ray intensity distribution, an error $\epsilon_n$ is determined by the following equation, and it may be determined from $\Delta y$ when the error is minimum.

$$\epsilon_{rr}(\Delta y) = \int_{-a}^{a} [V_1(y, t_1) - V_0(y - \Delta y, t_0)]^2 dy \quad (4)$$

The correction required when the exposure intensity distribution expands or reduces in the y direction together with the change of the peak position of the exposure intensity distribution may be accomplished in the following manner. When the X-ray intensity distributions measured before and after the variation can be approximated by the following equations (5) and (6), and the exposure intensity distribution before the change can be approximated by a quadratic equation (7):

$$V0(y) = a_0(y - y_{p0})^2 + V_{p0} \quad (5)$$

$$V1(y) = a_1(y - y_{p1})^2 + V_{p1} \quad (6)$$

$$D0(y_1 t_1) = (b \cdot D(y - y_4)^2 + D_p) \cdot f(t) \quad (7)$$

then, the exposure intensity distribution after the change is as follows:

$$D_1(y, t) = \left[ b \cdot \frac{a_0}{a_1}(y - y_d - \Delta y)^2 + D_P \cdot \frac{V_{P1}}{V_{P0}} \right] \cdot f(t) \quad (8)$$

where $\Delta y = y_{p1} - y_{p0}$, and f(x) is a value dependent on the time D1 (y, t).

When the X-ray intensity distributions before and after the change are Gaussian distributions defined by equations (9) and (10), and the exposure intensity distribution before the change is expressed by equation (11), the exposure intensity distribution is corrected by equation (12):

$$V_0(y) - V_{P0} \exp\left(-\frac{(y - y_{P0})^2}{2\sigma_0^2}\right) \quad (9)$$

$$V_1(y) - V_{P1} \exp\left(-\frac{(y - y_{P1})^2}{2\sigma_1^2}\right) \quad (10)$$

$$D_0(y) - D_{P0} \exp\left(-\frac{(y - y_d)^2}{2\sigma_d^2}\right) \cdot f(t) \quad (11)$$

$$D_1(y) = D_{P1} \exp\left(-\frac{(y - y_d - \Delta y_P)^2}{2\{\sigma_d \cdot (\sigma_0/\sigma_1)\}^2}\right) \cdot f(t) \quad (12)$$

If the X-ray intensity distribution changes so great that it cannot be approximated by a particular equation or function, the following correction will be made.

If the original X-ray intensity distribution V0 (y) having the peak at $y_{p0}$ changes to an X-ray intensity distribution V1 (y) having the peak at $y_{p1}$, the exposure intensity distribution D1 (y, t) is corrected to:

$$D_1(y, t) = \frac{V_1(y - y_{P1})}{V_0(y - y_{P0})} D_0(y - \Delta y, t) \quad (13)$$

The X-ray detector is slightly damaged when it is irradiated with the X-rays. The degree of the damage is dependent on the total dose, and therefore, the amount of X-rays incident thereon is preferably reduced. For this purpose, a filter may be provided in front of the X-ray detector.

Figure 6:
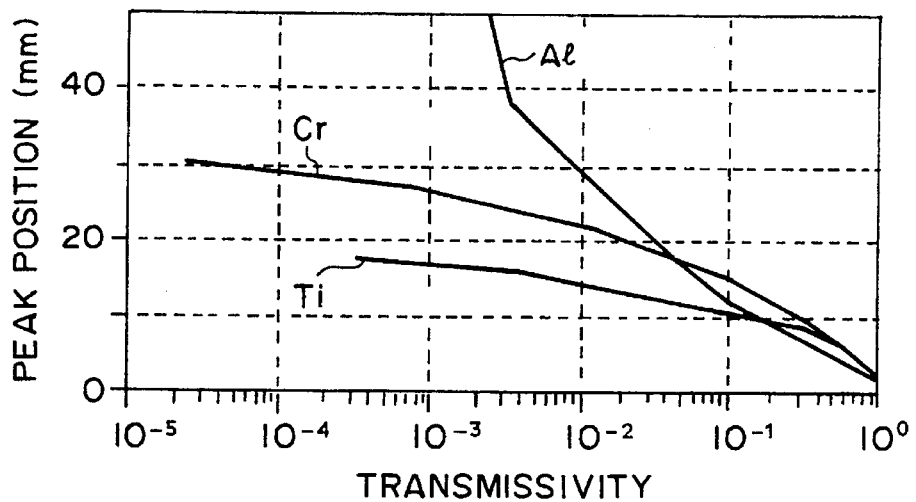
FIG. 6 shows a relation between transmissivity of a filter and a peak position of the X-ray intensity distribution.

However, the reflectance of the mirror relative to the SR-X-rays is dependent on the wavelength and the angle of incidence, and therefore, the position of the peak is deviated upwardly with an increase of the thickness of the filter even to the extent that it is out of the exposure region. FIG. 6 shows a relationship between the transmissivity and the peak position of the X-ray intensity distribution in the case of an aluminum filter, a Cr filter, and a Ti filter. Therefore, it is preferable that the thickness of the filter is selected in accordance with the material of the filter used so that the peak position remains in the exposure region.

Figure 7:
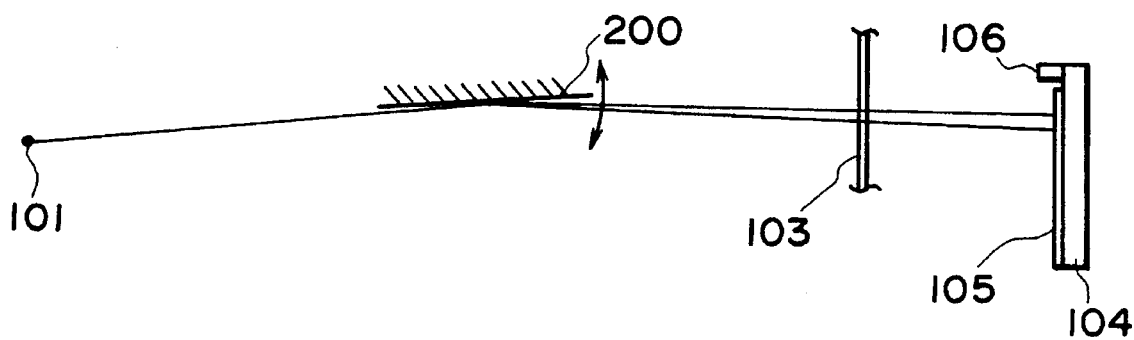
FIG. 7 illustrates a swingable mirror type X-ray exposure apparatus.

This embodiment is usable with a swingable mirror type X-ray exposure apparatus as shown in FIG. 7. In this case, sheet-like X-rays L are swung as indicated by an arrow by swinging a flat surface mirror 200, thus expanding the X-ray irradiation area. By changing the swinging speed of the mirror, the exposure period is controlled. In the beforehand measurement of the X-ray intensity distribution, the stage is fixed such that the X-ray detector 6 is at a proper position in the exposure region, and the mirror is swung. Then, the X-ray intensity is measured, and the stage is sequentially moved to determine the X-ray intensity distribution in the exposure area. On the basis of the X-ray intensity distribution thus determined, the X-ray intensity distribution is corrected through the method described above, and the mirror swinging speed is controlled to provide a proper exposure period.

This embodiment is applicable to a stage scanning type exposure apparatus in which a mask and a wafer are fixed on a stage, and the stage is moved to expand the exposure area in effect. In this case, the stage moving speed may be corrected to provide the proper exposure period in accordance with the corrected exposure intensity distribution.

According to this embodiment, when the SR-X-ray optical path changes due to the variation or vibration of the radiation angle due to the orbit electron injection and the displacement of the point of emission due to the temperature change or the like, the change of the exposure intensity distribution is estimated through a simple method without measuring the exposure intensity distribution, again, and therefore, the shutter moving speed curve or profile can be properly corrected. As a result, the exposure non-uniformity attributable to the change of the optical path of the SR-X-rays can be easily reduced.

Embodiment 2

Figure 8:
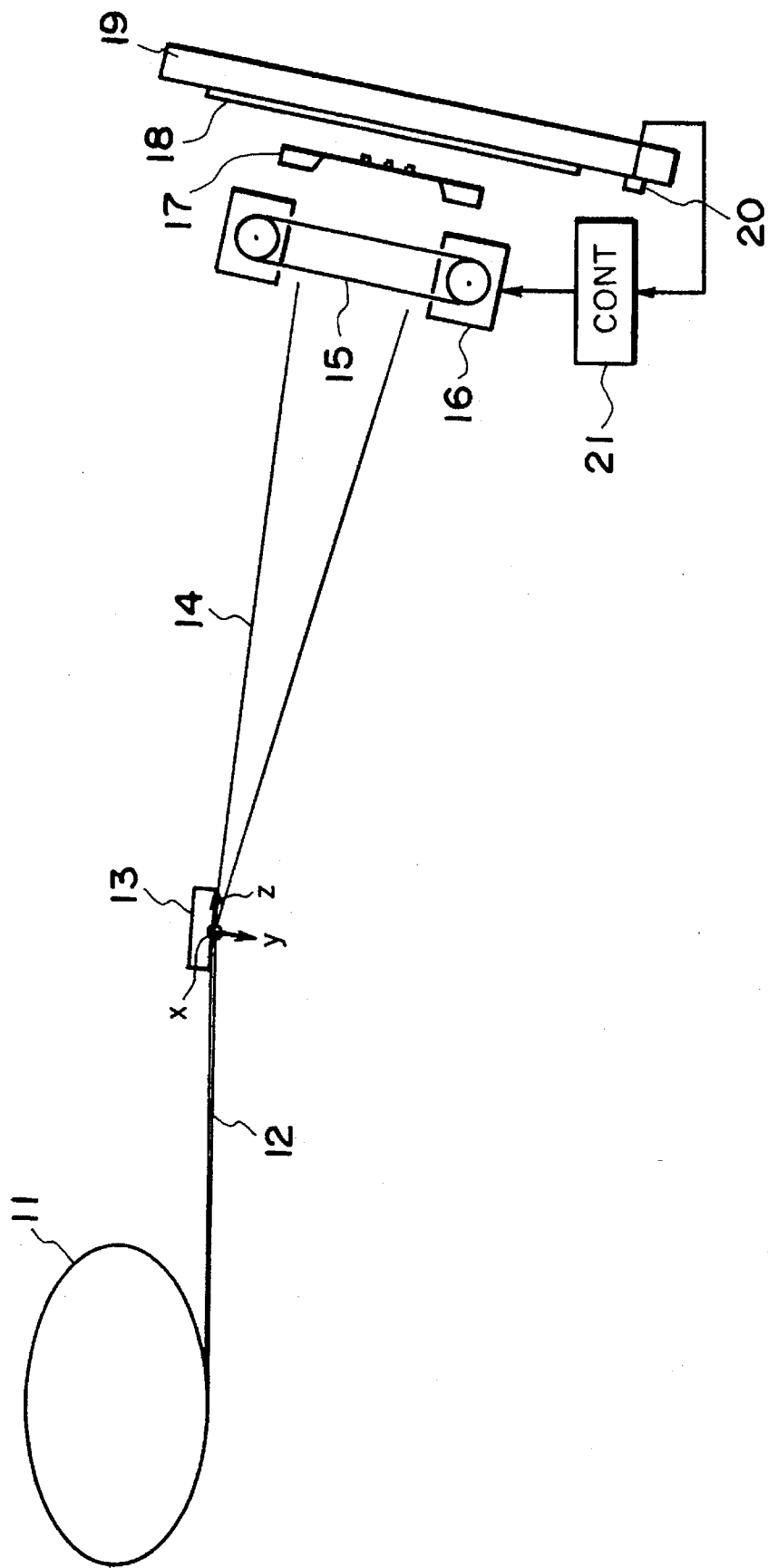
FIG. 8 shows an X-ray exposure apparatus according to a second embodiment of the present invention.

FIG. 8 shows an X-ray exposure apparatus according to a second embodiment of the present invention. The SR-X-rays 12 emitted from the SR generator 11 functioning as an X-ray source are incident on a cylindrical mirror (convex mirror) 13 of SiC having a radius of curvature R=56.7 m with an inclined incident angle of 15 mrad. The mirror 13 has a convex configuration because the function thereof is to expand the SR radiation 12 in the form of a sheet when emitted from the SR generator 11. Therefore, the curvature is so formed that the surface is away from the SR generator 11. The SR radiation 14 reflected by the mirror 13 is transmitted through a reticle in the form of a transmission type mask 17 having an X-ray transmission film on which a desired pattern is formed by an X-ray absorbing material, so that the desired pattern of the X-rays is incident on a substrate (wafer) 18 coated with resist material sensitive to the X-rays. Upstream of the mask 17, there is disposed a shutter 15 for controlling the exposure period over the entire exposure area. The shutter 15 is driven by a shutter driving unit 16 controlled by a shutter control unit 21. On the wafer stage 19, an X-ray detector 20 is disposed. At a light receiving portion of the X-ray detector 20, there is a pin-hole having a diameter of 0.7 mm. Although not shown in the Figure, a thin Be film having a thickness of 12 μm is disposed downstream of the mirror 13 and upstream of the shutter 15. The upstream side of the thin film is under ultra-high vacuum, and the downstream side thereof is in a pressure reduced He environment.

The description will be made as to the method of obtaining an exposure intensity distribution on the basis of the remaining film ratio of the resist material. When the exposure is carried out under constant conditions except for changing the exposure amount, the film remaining ratio is a function of the amount of exposure in the case of a negative resist. Conversely, the exposure amount is a function of the film remaining ratio. In view of this, at a predetermined position in the exposure area and at a constant accumulated current, several exposure operations are carried out with only the exposure period being changed, and thereafter, the resist is developed, and then the film remaining ratio is determined. By doing so, the functional relation between the film remaining ratio and the exposure period is determined. If it is assumed that the film remaining ratio 90% is the optical exposure, the exposure amount corresponding to the exposure period is the optimum amount of the exposure. Therefore, the entire exposure area is exposed to the radiation for a constant period of time at the accumulated current, and thereafter, the resist is developed, and the film remaining ratio is determined. By doing so, the exposure amount distribution is determined in the form of a ratio relative to the optimum exposure amount over the entire exposure area. If the exposure amount thus determined is divided by the exposure period, the exposure intensity distribution is determined. If a positive resist material is used, the same analysis is possible using the fact that the thickness of the remaining film is a function of the exposure amount. The exposure time period is not necessarily constant all over the exposure area, but the exposure period may be any if it is known.

FIG. 9 shows an exposure intensity distribution (solid line) in a unit $mW/cm^2$ and an output (broken line) of an X-ray detector 20 placed on a wafer stage 19. The exposure intensity is energy per unit volume and unit time. In this embodiment, the thickness of the resist is 1 μm, and therefore, the unit $mW/cm^2$ is used in place of $mW/cm^2/\mu m$ in the sense that the energy is absorbed by the 1 μm-thick resist per unit volume. As will be understood from this Figure, the profile of the output of the X-ray detector 20 is significantly different from the exposure intensity distribution, and therefore, the output of the X-ray detector 20 cannot be deemed as the exposure intensity distribution. In the X-ray exposure, the relative positional deviation among the point of emission, at least one mirror and the mask and the wafer results in exposure non-uniformity.

FIG. 10 shows an exposure intensity distribution determined by a film remaining ratio of the resist material when the mirror 13 changes its position by 10 μm and 50 μm in the y direction (the direction normal to the mirror surface, that is, inclined by 15 mrad relative to the normal line of the SR orbit plane). The solid line represents no position change: a dot line represents a 10 μm deviation; and a broken line represents a 50 μm position change. As will be understood, the maximum exposure intensity change from a 10 μm positional change is approx. 0.4%, and the maximum exposure intensity change resulting from a 50 μm positional change is approx. 2%. Therefore, without the means for measuring the exposure intensity distribution, the 0.4% and 2% exposure non-uniformities occur with the result of reduced yield. On the other hand, it is not practical to determine the exposure intensity distribution on the basis of the film remaining ratio of the resist material whenever the position change occurs, because there are many causes of the position change, and the amounts thereof are not constant.

The exposure amount intensity distribution in the exposure area and the output of the X-ray detector 20 have substantially a one dimensional intensity distribution in a direction (y-direction) perpendicular to the SR orbit plane in this embodiment. When an exposure intensity distribution is DO (y), and an output of the X-ray detector 20 is $O_0$ (y) under certain conditions, the coefficient of proportion A (y) is:

$$A\ (y) = D0\ (y)/O_0\ (y) \tag{14}$$

Figure 11:
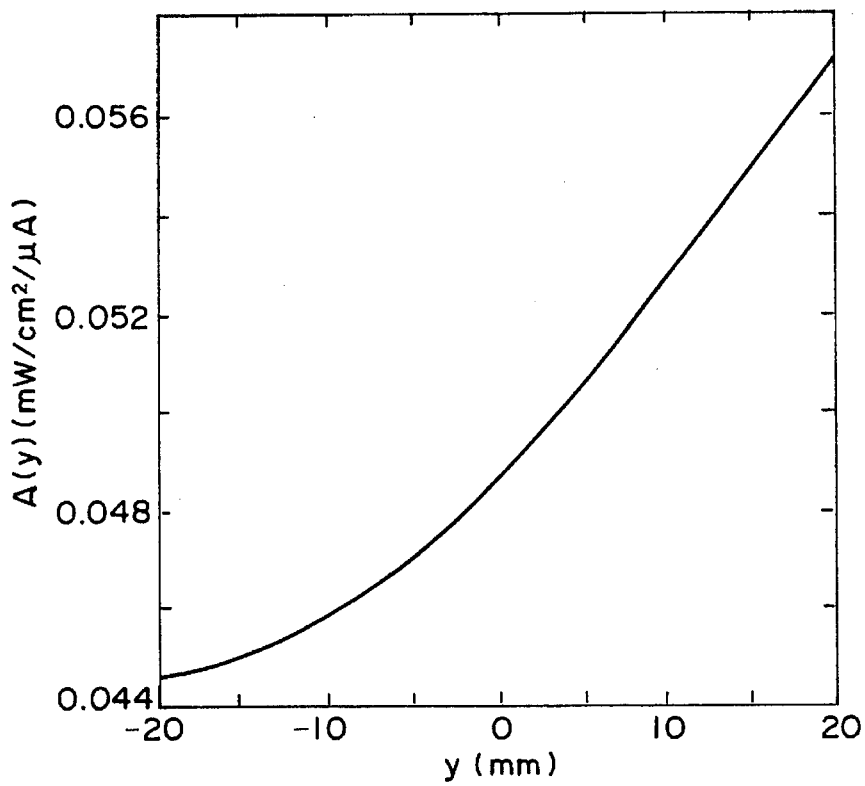
FIG. 11 is a graph of a ratio A (y) of the exposure intensity to an X-ray detector 10.
Figure 12:
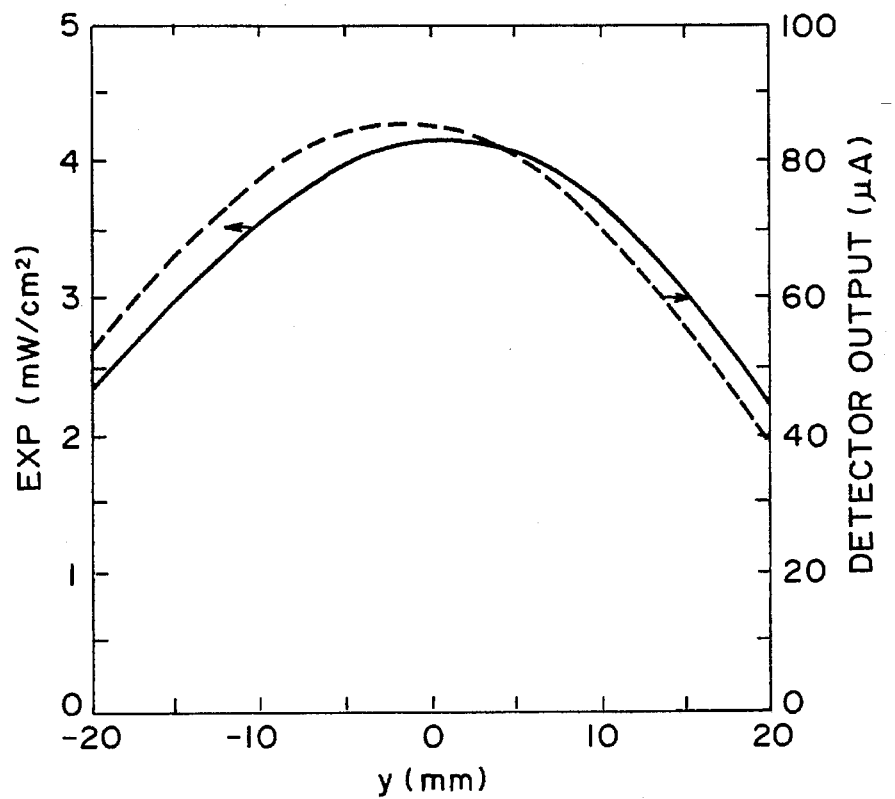
FIG. 12 is a graph of an exposure intensity distribution and an X-ray detector when the position of the mirror changes in the y direction by 10 μm.

FIG. 11 shows the coefficient of proportion A (y). The coefficient is obtained without the position change of the mirror 12. FIG. 12 shows the exposure intensity distribution and the output of the X-ray detector 20 when the mirror 13 changes its position by 10 μm in the y direction, and FIG. 13 shows the exposure intensity distribution and the output of the X-ray detector 20 when the mirror 13 changes its position by 50 μm in the y direction. An exposure intensity distribution and an output of the X-ray detector 20 under a condition different from that when the coefficient of proportion A (y) is determined by equation 14, are D1 (y), and $O_1$ (y). Then the D1' (y) is defined as the output $O_1$ (y) multiplied by the coefficient A (y).

$$D1'(y) = A(y) \times O_1(y) \tag{15}$$

The exposure intensity distribution D1' (y) is different from D1 (y), but it is determined on the basis of the coefficient A (y) predetermined under a condition and an output $O_1$ (y) of the X-ray detector 20 during exposure, and therefore, it can be even more quickly and easily than when the exposure intensity distribution D1 (y) is determined on the basis of the remaining resist film ratio after the exposure operation.

FIG. 14 shows an exposure intensity distribution D1 (y) and D1' (y) when the mirror 13 displaces by 10 μm in the y direction. The difference between D1 (y) and D1' (y) is 0.04% over the entire exposure area. FIG. 15 shows exposure intensity distributions D1 (y) and D1' (y) when the mirror 13 displaces by 50 μm in the y direction. The difference between D1 (y) and D1' (y) is 0.2% over the entire exposure area. Similarly, even if the mirror 13 changes its position by an unknown distance in the y direction, the exposure intensity distribution can be determined with such a high precision that the exposure non-uniformity is tolerable, by measuring the output $O_1$ (y) by the X-ray detector 20 and multiplying it by the coefficient A (y), even if the displacement of the mirror 13 is unknown.

FIG. 16 shows an exposure intensity distribution determined by the remaining resist film ratio when the mirror 13 rotates through 10 μrad and 50 μrad about an x-axis, a direction perpendicular to the emitting direction of SR radiation 2 in the SR orbit plane. The solid line represents no-change; the dot line represents a 10 μrad case; and the broken line represents a 50 μrad case. The exposure intensity distribution is approx. 0.3% at the maximum with a 10 μrad rotation, and is approx. 1.7% at the maximum with a 50 μrad rotation. Therefore, without the means for measuring the exposure intensity distribution, the exposure non-uniformities of 0.3% and 1.7% result. FIG. 17 shows an exposure intensity distribution and an output of the X-ray detector 20 when the mirror 13 rotates through 10 μrad, and FIG. 18 shows an exposure intensity distribution and an output of the X-ray detector 20 when the mirror 13 rotates through 50 μrad.

Figure 19:
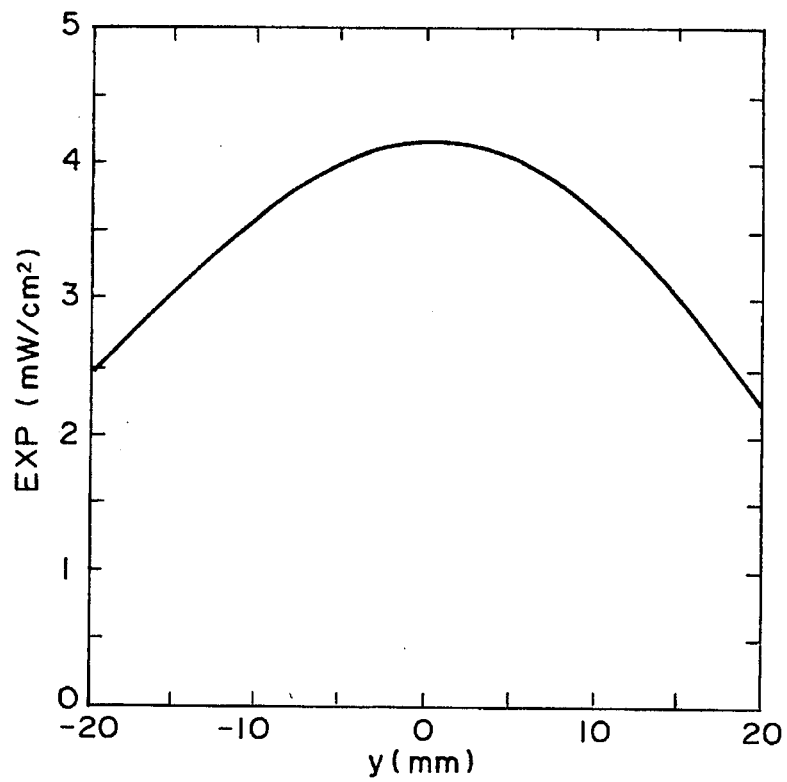
FIG. 19 is a graph of an exposure intensity distribution D1' (y) and D1 (y) when a mirror rotates through 10 μrad.
Figure 20:
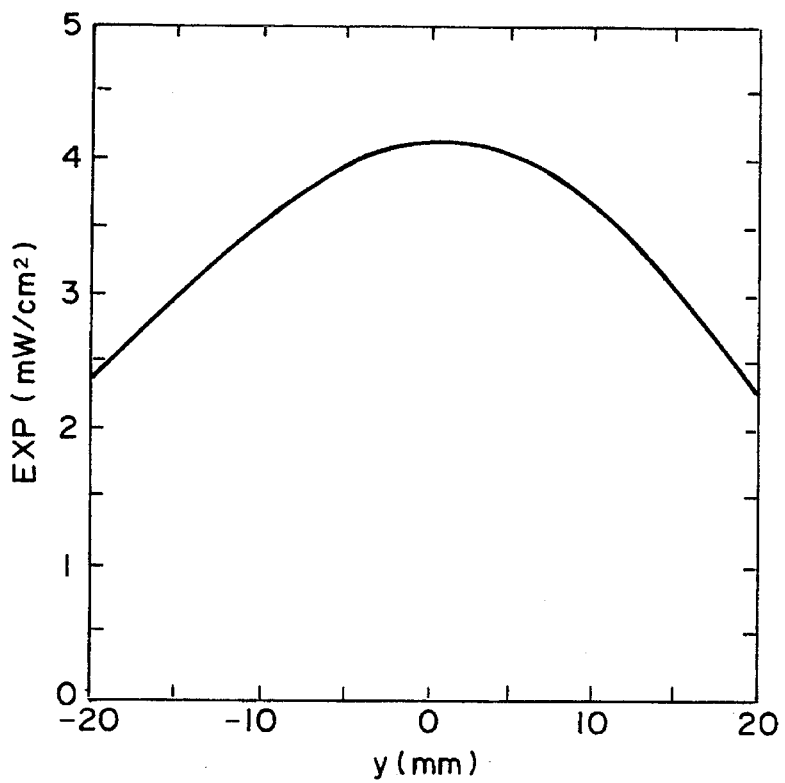
FIG. 20 is a graph of an exposure intensity distribution D1' (y) and D1 (y) when a mirror rotates through 50 μrad.

The broken line represents the exposure intensity distribution D1' (y) determined by multiplying the output of the X-ray detector 20 when the mirror rotates through 10 μrad by the coefficient A (y) shown in FIG. 11, and the solid line represents the exposure intensity distribution D1 (y) with the 10 μrad rotation, in FIG. 19. In FIG. 20, a broken line represents the exposure intensity distribution D1' (y) determined by multiplying the output of the X-ray detector 20 when the mirror 13 rotates through 50 μrad by the coefficient A (y), and the solid line represents the exposure intensity distribution D1 (y) when it is rotated through 50 μrad. As will be understood from FIG. 19, the exposure intensity distributions D1 (y) and D1' (y) are in accord with each other with the errors of 0.04% and 0.2% at the maximum over the entire exposure area. Similarly, even if the mirror 13 is rotated through an unknown distance about the x-axis, the exposure intensity distribution can be determined with such an accuracy that the exposure non-uniformity is tolerable by measuring the output $O_1$ (y) of the X-ray detector 20 and multiplying it by the coefficient A (y), even if the angular position of the mirror 13 changes.

Thereafter, the proper exposure period is calculated at each point in the exposure area, and the speed of the shutter 15 in the exposure area is determined by a shutter control unit 21 so that the shutter 5 is opened for a proper exposure period to expose the resist properly. A method of determining the speed of the shutter 15 in the exposure area when the proper exposure period for each point in the exposure area is given, and driving the shutter 15, is disclosed in Japanese Laid-Open Patent Application No. 243519/1989.

In this embodiment, the coefficient of proportion A (y) is determined under the condition that the mirror 13 does not make its position change. However, the accuracy of the exposure intensity distribution is hardly influenced even if the coefficient A (y) is determined under the condition that the mirror 13 changes in the y-direction by an unknown amount, or even if the coefficient A (y) is determined under the condition that it is rotated about the x-axis by an unknown amount. The present invention is applicable to such cases. In the case other than the case of the change in the y position or rotational position Ax of the mirror, the exposure intensity distribution can be determined with such an accuracy that the exposure non-uniformity is tolerable by measuring the output $O_1$ (y) of the X-ray detector and multiplying it by the coefficient A (y). This applies to the position change of the point of emission, mask or wafer. When the mirror 13 rotates about the y-axis or the z-axis, the X-ray intensity distribution and the exposure intensity distribution are two dimensional distributions. At this time, the exposure intensity distribution can be determined by the following equation:

$$D1'(x, y) = A(y) \times O_1(x, y) \tag{16}$$

Embodiment 3

Figure 21:
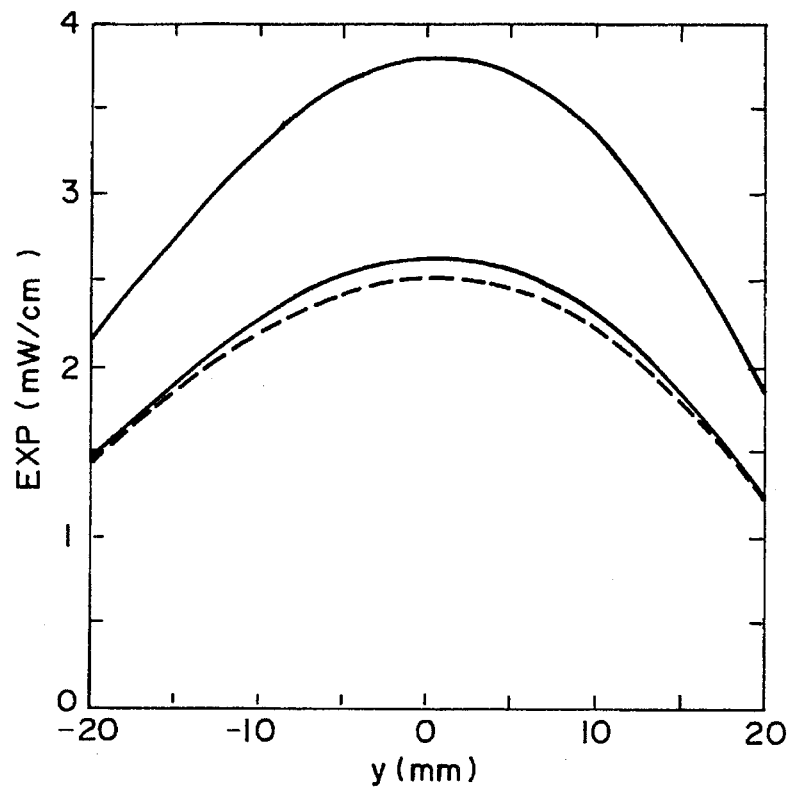
FIG. 21 is a graph of an exposure intensity distribution when the accumulation current is 300 mA and 200 mA.

The shape of the electron beam and the angular component of the speed of the SR generator 11 are both a Gaussian distribution or substantially a Gaussian distribution. It is assumed that a position, in a direction perpendicular to the SR orbit plane, of the electrons in the electron beam of the SR generator 11 is y, and an angular component, in a direction perpendicular to the SR orbit plane, of the speed of the electrons is y' and the standard deviations of the variations are σy and σy'. The SR generator apparatus 11 is such a light source that the accumulation current attenuates with time in an exponential function fashion, but it has recently been found that the standard deviations σy and σy' change with the accumulation current. In FIG. 21, the solid line indicates the exposure intensity distribution when the accumulation current is 300 mA (σy=0.8 mm, σy'=0.3 mrad) and when it is 200 mA (σy=0.74 mm, σy'=0.26 mrad). The higher intensity represents the 300 mA case. The broken line indicates the exposure intensity distribution multiplied by ⅔ when the accumulation current is 300 mA. Since the standard deviations σy and σy' change with accumulation current, the exposure intensity distribution of the 200 mA case is different from the exposure intensity distribution of the 300 mA case multiplied by ⅔. For this reason, it is desirable that the exposure intensity distribution is determined at each accumulation current with such an accuracy that the exposure non-uniformity is tolerable.

Figure 22:
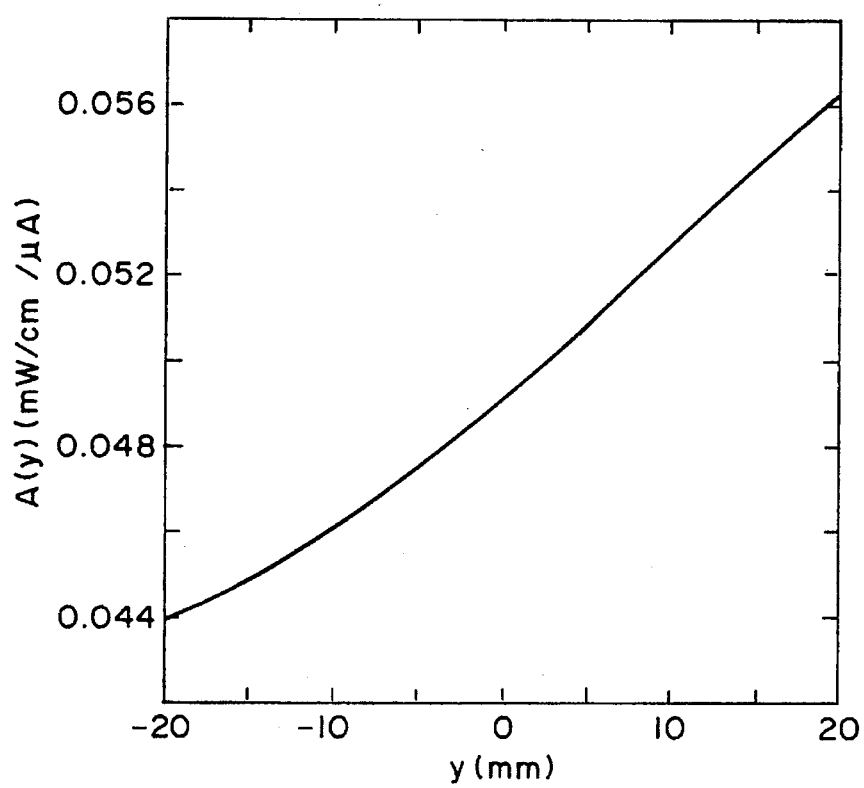
FIG. 22 is a graph of a ratio A (y) of an exposure intensity distribution and an X-ray detector output when the accumulation current is 300 mA.
Figure 23:
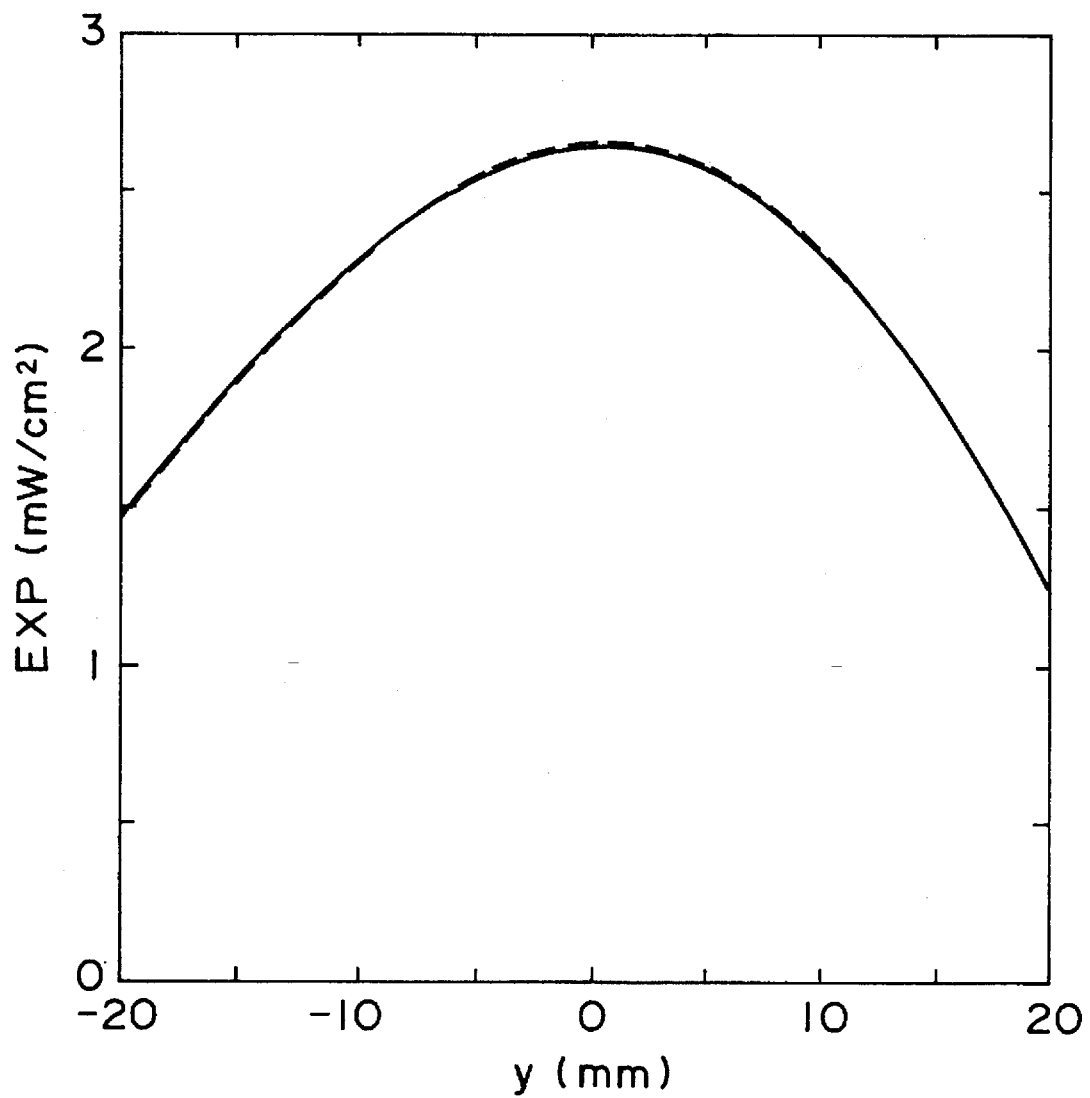
FIG. 23 is a graph of an exposure intensity distribution D1 (y) and D1' (y) (broken line) when the accumulation current is 200 mA.

FIG. 22 shows a ratio A (y) of the exposure intensity distribution at 300 mA of the accumulation current and the output of the X-ray detector 20. In FIG. 23, a solid line shows an exposure intensity distribution D1 (y) when the accumulation current is 200 mA, and a broken line shows D1' (y) obtained by multiplying A (y) by the output $O_1$ (y)

of the X-ray detector when the accumulation current is 200 mA. They are different by 0.4% approximately adjacent to the center of the exposure. If the exposure intensity distribution is determined by multiplying the output of the X-ray detector 20 by A (y), it can be determined with 0.4% error.

Embodiment 4

Figure 24:
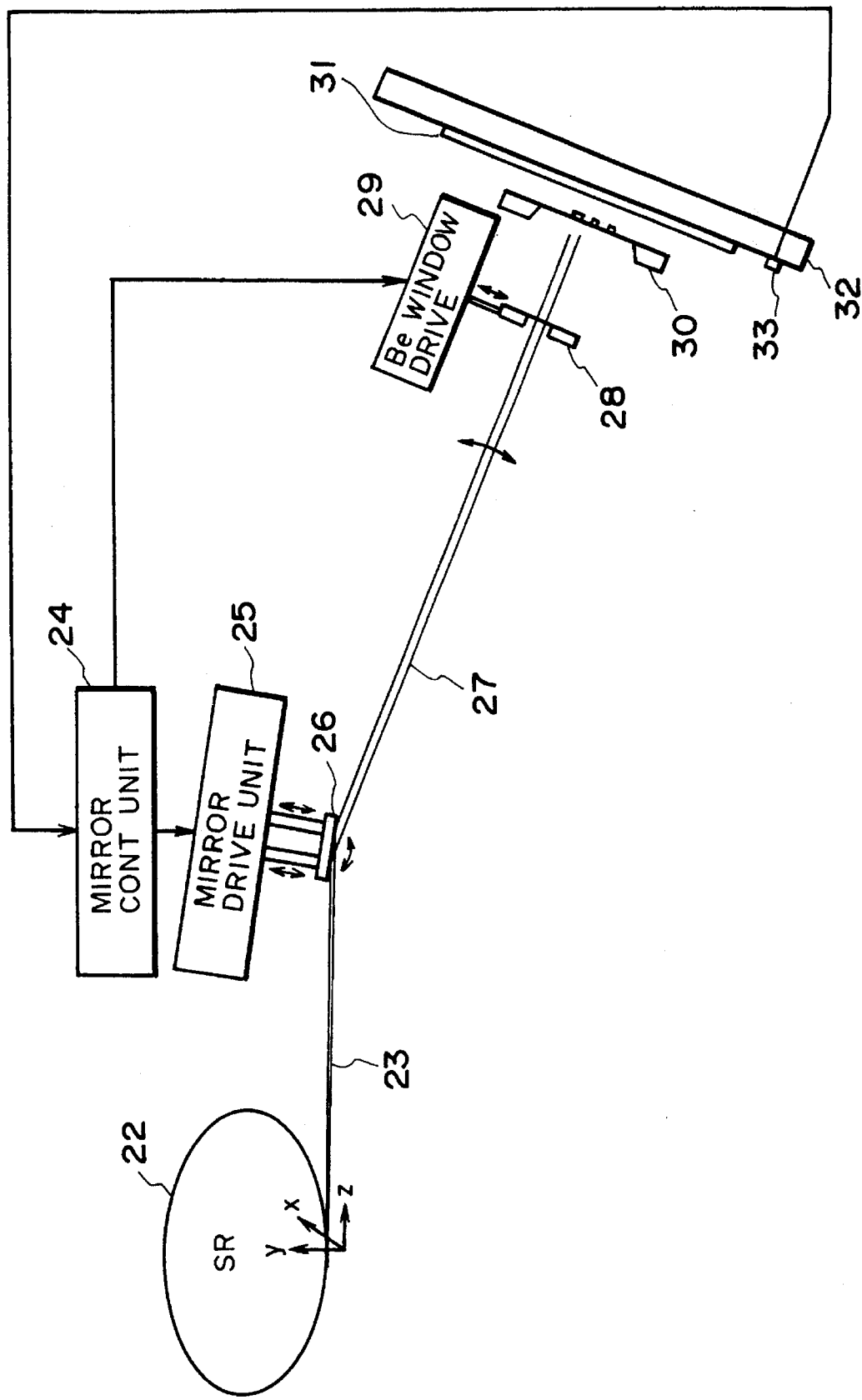
FIG. 24 illustrates an X-ray exposure apparatus according to a fourth embodiment of the present invention.

FIG. 24 illustrates an X-ray exposure apparatus according to a fourth embodiment of the present invention. The SR radiation 23 emitted from the SR generator 22 functioning as the X-ray source is incident on a swingable flat surface mirror 26 of S1 disposed at a position 3 m away from the point of emission with an angle of inclined incidence of 11–19 mrad. The SR radiation 23 in the form of a sheet is expanded. The SR radiation 27 reflected by the mirror is transmitted through a reticle in the form of a transmission type mask 30 having an X-ray transmission film on which a desired pattern is formed by an X-ray absorbing material, so that the desired pattern of the X-rays is incident on a substrate (wafer) 31 coated with resist material sensitive to the X-rays. In front of the mask, there is an opening (Be window 28) movable in synchronism with a mirror 26, and the thin film of Be having the thickness of 12 μm functions as a vacuum isolator. The upstream side of the thin film is under the ultra-high vacuum, and the downstream side is in a pressure reduced He environment. In order to assure sufficient strength against the pressure difference, the Be window 28 has a width of 10 mm in the y-direction (the direction perpendicular to the SR orbit plane). It is vibrated in synchronism with the mirror 26 so as not to block the SR radiation 27 when the mirror 26 vibrates. When the SR radiation 27 is expanded to cover the exposure area of the wafer 31 by swinging the mirror, the exposure intensity is defined on the basis of the exposure amount when the SR radiation 27 in the form of a sheet swings at a constant speed on the wafer substrate 31. In other words, the exposure intensity is determined on the basis of the remaining resist film ratio or the line width accuracy after such an exposure operation.

Figure 25:
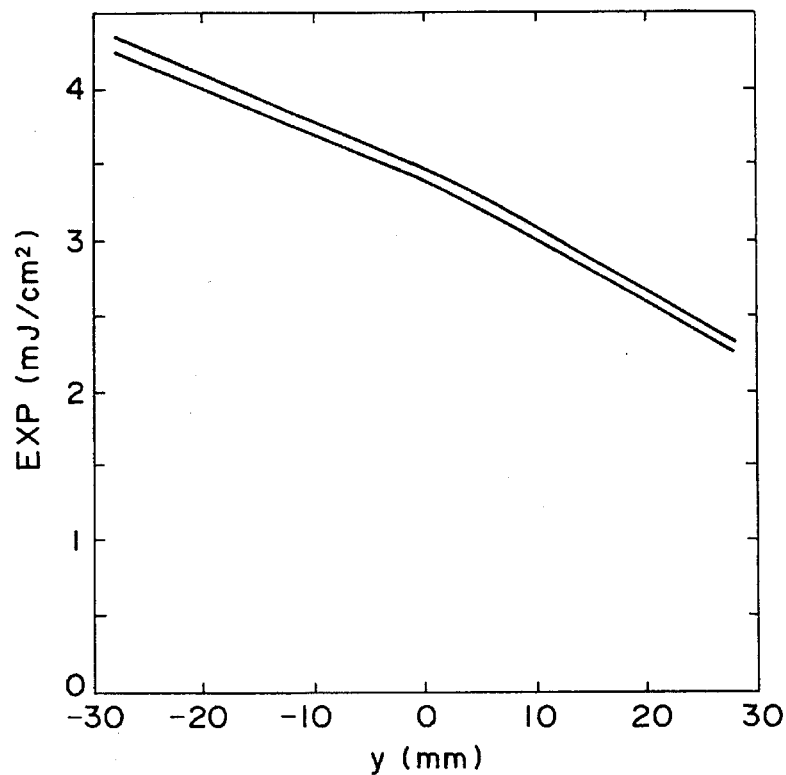
FIG. 25 is a graph of an exposure intensity distribution when an emitting direction of SR changes by Δωx=0.05 mrad and 0.15 mrad, together with the X-ray detector output without the change.
Figure 26:
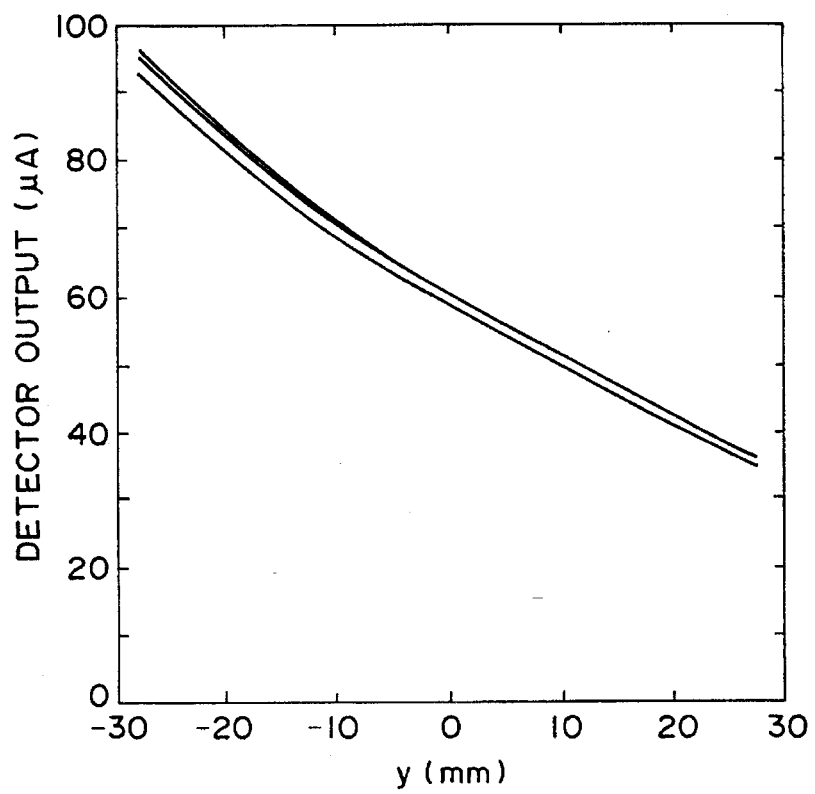
FIG. 26 is a graph of an X-ray detector output when the emitting direction of SR changes by Δωx=0.05 mrad and 0.15 mrad, together with the X-ray detector output without the change.

The inclination, relative to a horizontal plane, of the SR light 23 emitted from the point of emission of the SR generator 22 changes, when, for example, the temperature distribution changes in a space in which the SR generator 22 is placed. More particularly, it rotates about the X-axis in FIG. 24. FIG. 25 shows an exposure intensity distribution when the emitting direction of the SR radiation 23 changes by Δωx=0.05 mrad or 0.15 mrad, together with the exposure intensity distribution without these changes. The higher intensity represents the 0.05 mrad case. This is on the basis of the exposure amount provided by one swinging operation at the constant speed of 40 mm/sec of the sheet-like SR radiation 27 on the wafer substrate 31 by swinging motion of the mirror 26. By rotation of the SR radiation 23 emitting direction by 0.05 mrad and 0.15 mrad, the exposure intensity distribution changes by 0.4% and 2.7%. Therefore, when the change of the exposure intensity distribution is not detected, the exposure non-uniformities of 0.4% and 2.7% result. FIG. 26 shows the output of the X-ray detector 33 when the SR radiation 23 emitting direction changes by Δωx=0.05 mrad and 0.15 mrad, together with the output of the X-ray detector 33 without the change. The higher intensity represents the 0.05 mrad case.

Figure 27:
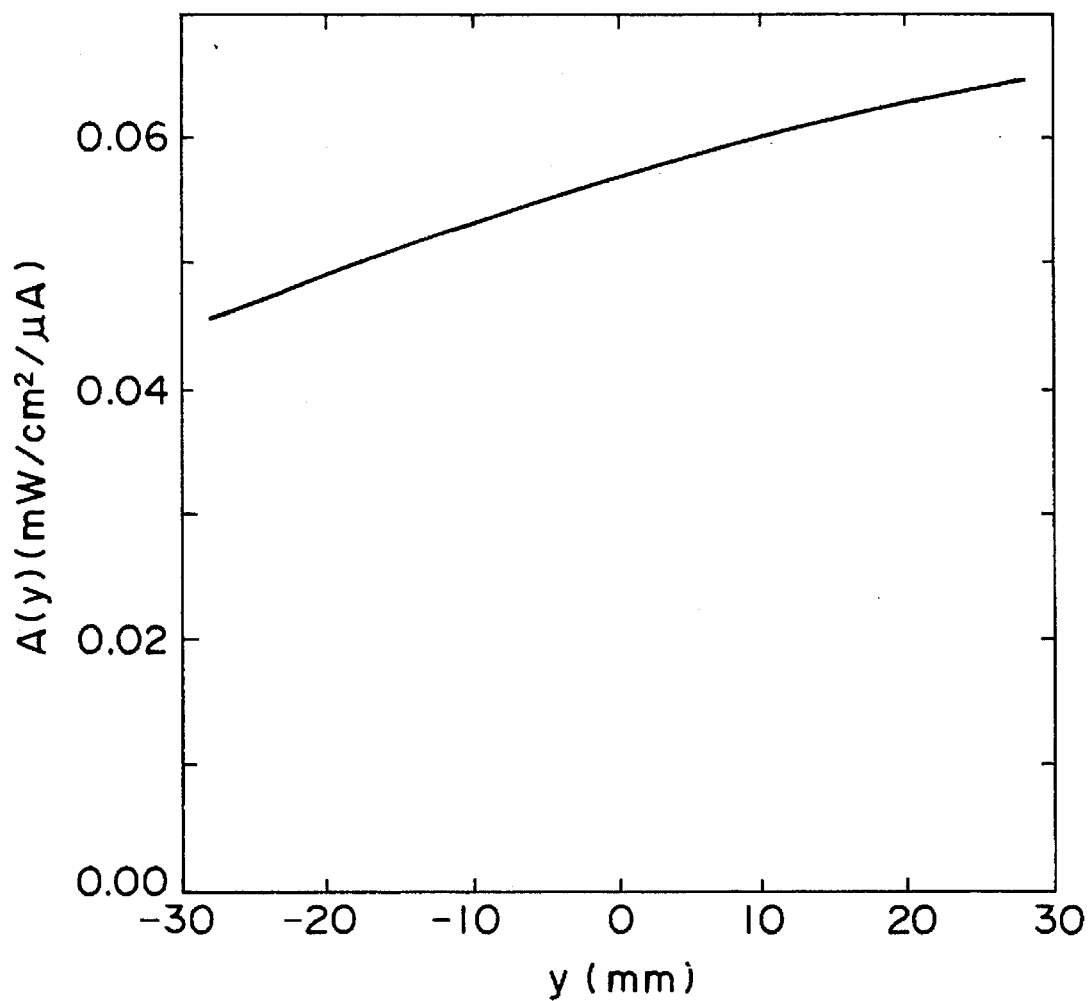
FIG. 27 is a graph of a ratio A (y) of an exposure intensity distribution and an X-ray detector output when the emitting direction of SR does not change.
Figure 28:
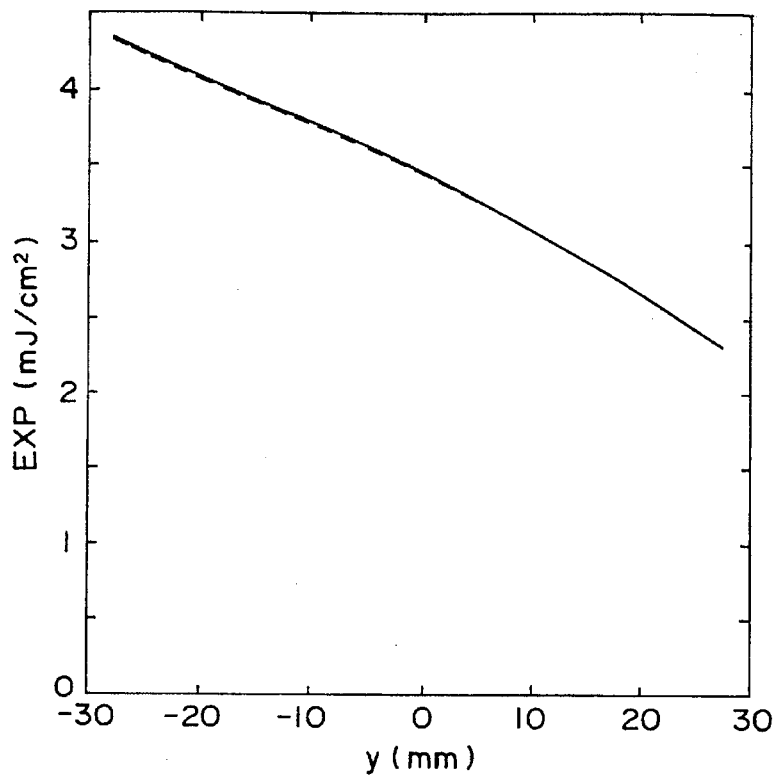
FIG. 28 is a graph of an exposure intensity distribution D1 (y) and D1' (y) when the emitting direction of SR rotates by Δωx=0.05 mrad.
Figure 29:
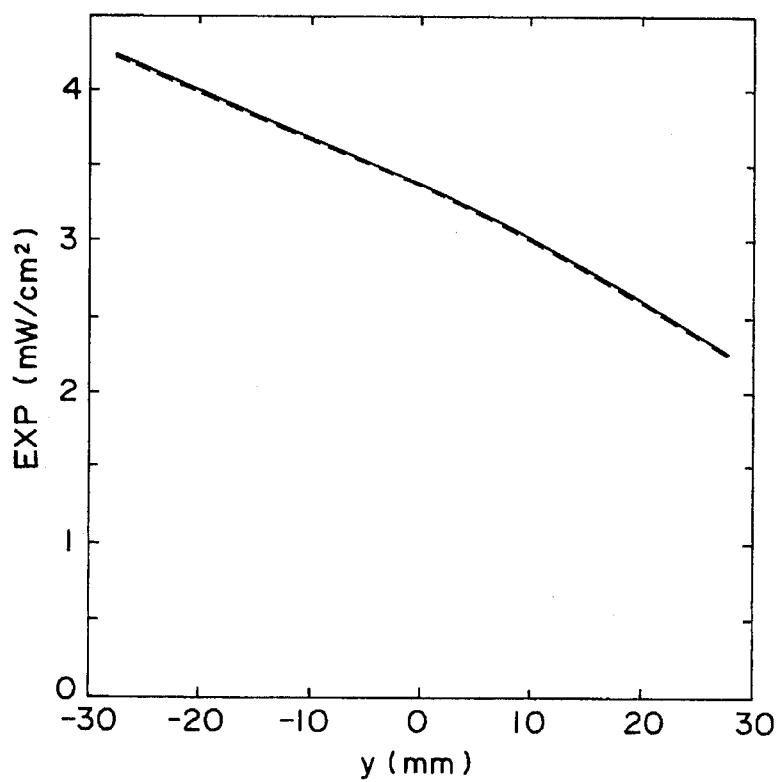
FIG. 29 is a graph of exposure intensity distributions D1 (y) and D1' (y) when the emitting direction of SR rotates through Δωx=0.05 mrad.

FIG. 27 shows a ratio A (y) of the exposure intensity distribution and the X-ray detector 33 when the emitting direction of the SR light 23 does not change. FIG. 28 shows the exposure intensity distribution and a value of D1' (y) which is the output of the X-ray detector 33 $O_1$ (y) multiplied by a coefficient of proportion A (y). In the exposure region (−15 mm–15 mm), they are in accord with an accuracy of 0.2%. In FIG. 29, there is shown the exposure intensity distribution and a value of D1' (y) which is the output $O_1$ (y) of the X-ray detector 33 multiplied by the coefficient A (y) when the emitting direction of the SR radiation 23 rotates by Δωx=0.15 mrad. They are in accord with each other with an accuracy of 0.5% in the exposure region. This embodiment is more efficient when the positional change is larger.

The exposure amount control during the swinging motion of the mirror is effected on the basis of the following. When the emitting direction of the SR radiation 23 is not changed under the condition that 6 mJ/cm² is required to expose the resist having a thickness of 1 μm, for example, the exposure amount is 3.47 mW/cm² at y=0 mm when the speed of the swinging motion is 40 mm/sec on the wafer substrate 31. Therefore, the mirror 26 is driven by a mirror driving unit 25 through a mirror control unit 24 so as to provide the speed of 23.1 (mm/sec)=40/(6/3.47), at y=0 mm. Generally, the swinging motion of the mirror 26 is controlled so as to provide the speed of 40/(6/E) (mm/sec) at y, when the exposure amount is E (mW/cm²) at y.

As described in the foregoing, the exposure intensity distribution can be quickly determined with such an accuracy that the exposure non-uniformity is tolerable, without correct measurement of the amount of the profile change of the electron beam, which may result from a reduction of the accumulation current or the relative positional deviation among the point of emission, at least one mirror, mask and the wafer. Therefore, the exposure amount non-uniformity can be avoided.

Embodiment 5

Figure 30:
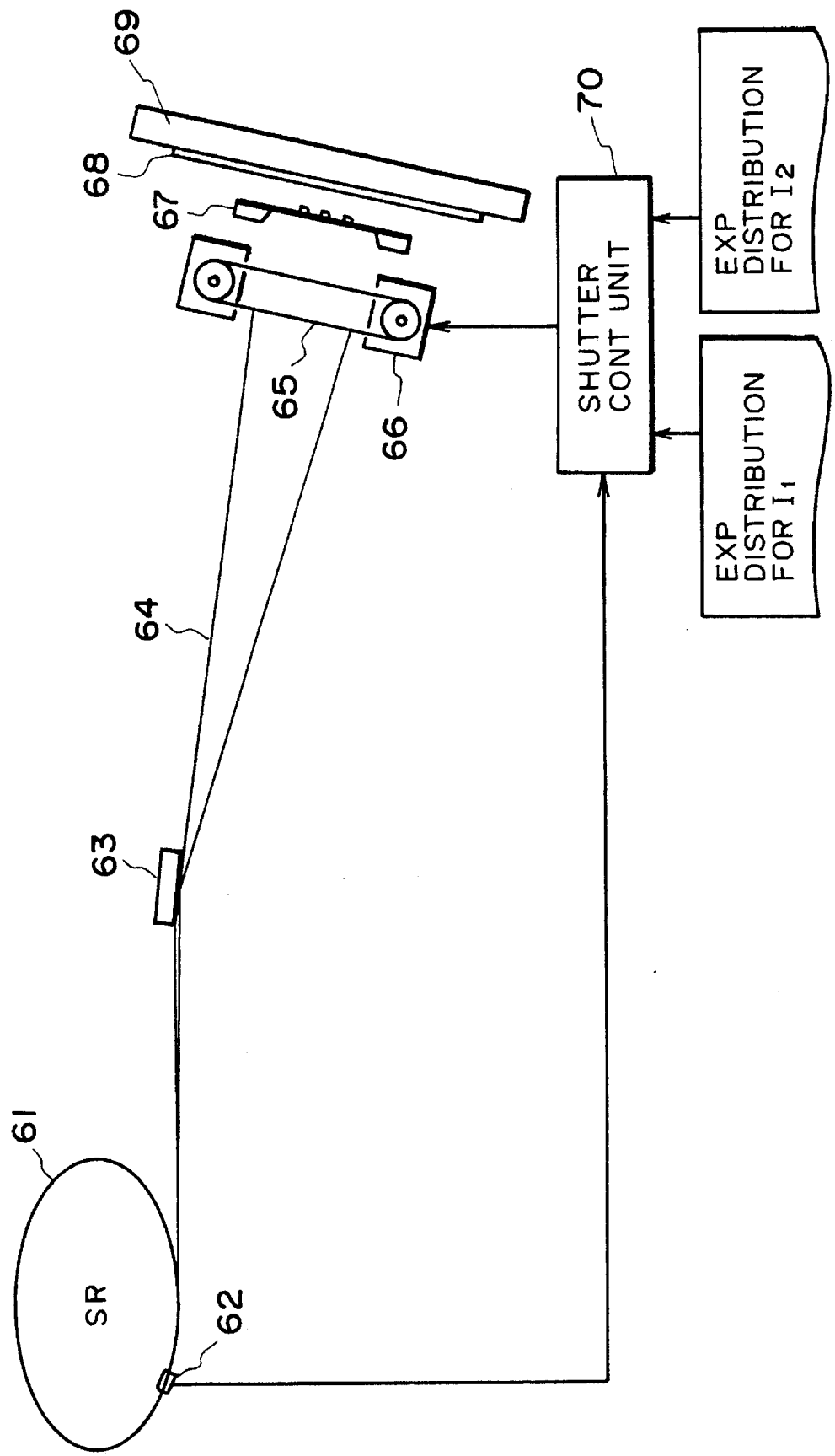
FIG. 30 illustrates an X-ray exposure apparatus according to a fifth embodiment of the present invention.

FIG. 30 illustrates an X-ray exposure apparatus according to a fifth embodiment of the present invention. The SR radiation emitted from the X-ray source in the form of an SR generator 61, is incident on a convex mirror 63 of SiC having a radius of curvature R=56.7 m and disposed 3 m away from the point of emission. The SR radiation reflected by the mirror 63 is transmitted through a transmission type mask 67 (reticle) having a pattern of X-ray absorbing material on an X-ray transparent film so that it is shaped into the pattern, and then, it is incident on the substrate (wafer) 68 on the wafer stage 69 on which the resist sensitive to the SR radiation is applied. Upstream of the mask 67, there is disposed a shutter 65 for controlling the exposure period over the entire exposure area. The shutter 65 is driven by a shutter driving unit 66 controlled by a shutter control unit 70. An unshown thin film of Be having a thickness of 12 μm is disposed downstream of the mirror 63 and upstream of the shutter 65. The thin film makes isolation between the upstream ultra-high vacuum and the downstream reduced pressure He environment. The accumulation current of the SR generator 61 is measured by DCCT 62.

Figure 31:
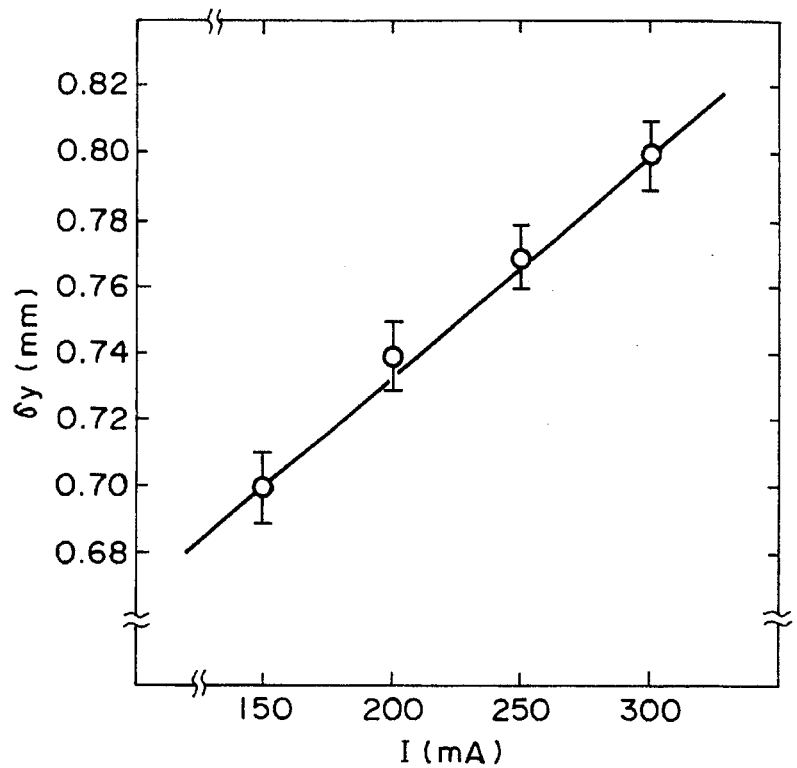
FIG. 31 is a graph of a dependency of σy on the accumulation current of a typical SR.
Figure 32:
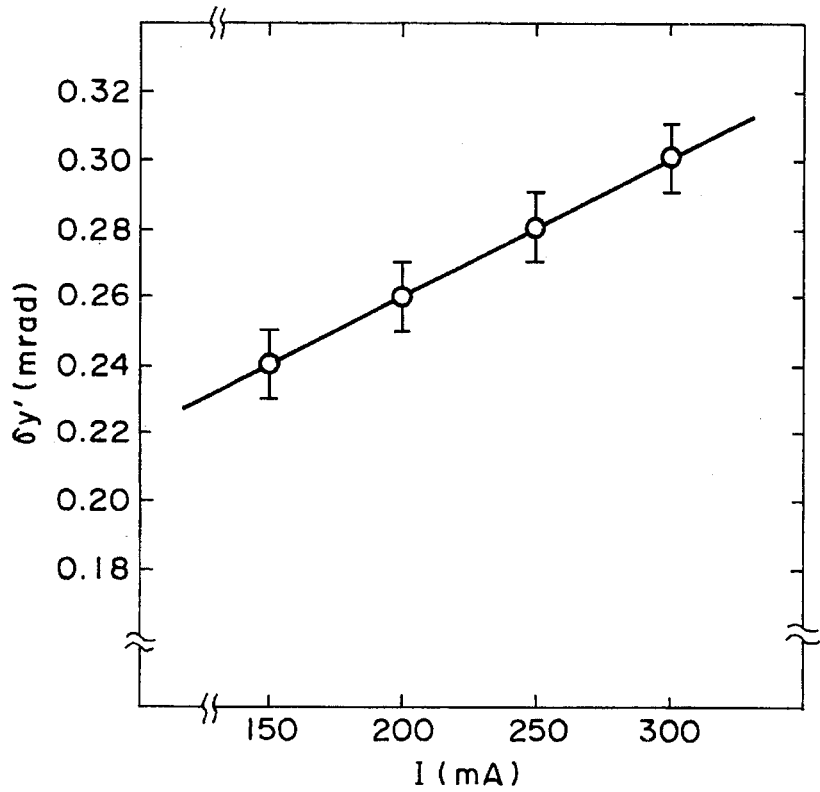
FIG. 32 is a graph of a dependency of σy' on an accumulation current of a typical SR.

Referring to FIG. 33, there is shown in a solid line, a calculated energy which is absorbed by a chemical sensitization resist containing halogen element and having a thickness of 1 μm from the SR radiation 64 emitted from a typical SR generator having a dependency σy and σy' shown in FIGS. 31 and 32. Because the optimum exposure is provided when the energy absorbed by the resist has a predetermined level, the value is in accord with the exposure intensity predetermined. However, in the axial exposure, it changes depending on the non-uniformity of the reflectance of the mirror 63, the non-uniformity of the thickness of the Be thin film or the like. In view of this, it is desirably determined on the basis of measurement of the remaining resist film ratio or the like. In FIG. 33, the four lines represent the accumulation currents 300 mA, 250 mA, 200 mA and 150 mA cases in an order from the high exposure intensity side. For a reference, the broken lines represent the exposure intensities obtained on the assumption that it is proportional to the accumulation current on the basis of the intensity distribution at the accumulation current of 300 mA and further on the assumption that the σy and σy' do not change depending on the accumulation current. They are for 250 mA, 200 mA and 150 mA of the accumulation currents, respectively, in the order from the higher exposure intensity side.

The optimum exposure amount of the chemical sensitization type resist material containing the halogen element used in this embodiment is 60 J/cm$^3$ and the optimum exposure period therefor at each point in the exposure area is indicated by a solid line in FIG. 34. In the Figure, they are for 300 mA, 250 mA, 200 mA and 150 mA in the order named from the shorter exposure period. In this embodiment, the speed of the shutter 65 is controlled so that the shutter 65 is opened for the exposure period at each point. For reference, the broken lines are the exposure periods at the points determined on the assumption that the σy and σy' do not change depending on the accumulation current, and the exposure intensity distribution is proportional to the accumulation current on the basis of the exposure intensity distribution at the accumulation current 300 mA. They are for 250 mA and 150 mA of the accumulation current in the order from the shorter exposure period. Accordingly, despite the use of the SR generator exhibiting the accumulation current dependency of the σy and σy' if the exposure period is determined on the assumption that the exposure intensity distribution is proportional to the accumulation current, the resulting exposure period is longer than the proper exposure period by 7% at the maximum at the center of the exposure area at 150 mA, for example. As a result, the amount of the exposure is larger than the optimum exposure amount, and therefore, the exposure non-uniformity is produced.

As a measure against the deviation of the exposure amount from the proper exposure amount, the exposure intensity distribution is measured at all of the accumulation current levels, and the exposure period at each point in the exposure area is set at all of the accumulation current levels. However, this is inefficient, and therefore, this embodiment uses the following method.

The dependency of σy and σy' upon the accumulation current exhibits high reproducibility if the control parameter of the SR generator is constant, and the same σy and σy' result for the same accumulation current. As shown in FIGS. 31 and 32, σy and σy' exhibit substantially linear inclination relative to the accumulation current. The level and inclination is different for the individual SR generator. When the σy and σy' of the electron beam expressed by equation (A) exhibits the dependency upon such an accumulation current level, the SR radiation from the electron beam is incident on the substrate having the resist material sensitive to the SR radiation, through an optical system having at least one mirror and through the mask. As a result, the exposure intensity distribution on the substrate having the resist is dependent on the accumulation current. In this case, the exposure intensity distribution is generally different from a Gaussian distribution, since the SR radiation has been applied by way of the optical system comprising at least one mirror.

In view of this, the exposure intensities for at least two accumulation currents are measured beforehand, and upon the exposure operation, the accumulation current is measured, and the change of the exposure intensity distribution attributable to the dependency of σy and σy' on the accumulation current is corrected. By doing so, the optimum exposure amount can be provided over the entire exposure area. It is assumed that the exposure intensity distributions at the accumulation currents $I_1$ and $I_2$ are P1 (x, y) and P2 (x, y). Then, the exposure intensity distribution for a given accumulation current level I, is $$P(I,x,y) = P_1(x,y) + \frac{P_2(x,y) - P_1(x,y)}{I_2 - I_1} (I - I_1) \qquad (B)$$

After the exposure intensity distribution is measured at each of three or more accumulation currents, the exposure intensity distribution at a given accumulation current can be determined by interpolation by using a quadrant or higher equation at each point.

Figure 35:
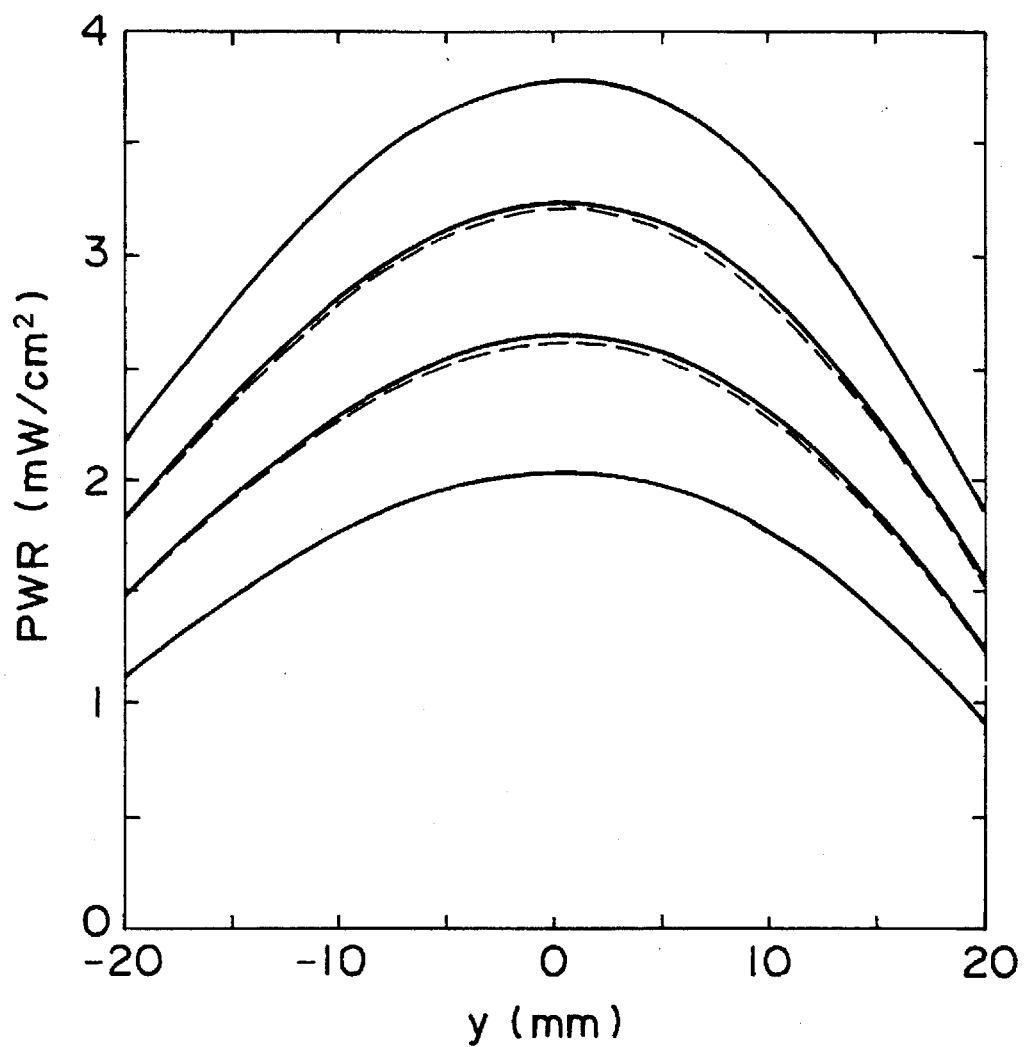
FIG. 35 is a graph of an exposure intensity distribution of an X-ray exposure apparatus according to the fifth embodiment.

Referring to FIG. 35, broken lines indicate the exposure intensity distributions determined by equation (B) for the accumulation currents of 250 mA and 200 mA from the exposure intensity distributions at the accumulation currents of 300 mA and 150 mA. In FIG. 35, there is also shown the exposure intensity distributions of FIG. 33 at the accumulation currents of 300 mA, 250 mA, 200 mA and 150 mA. According to this embodiment, at a given accumulated current level not limited to 250 mA or 200 mA, the exposure intensity distribution can be determined with an error of 1% or lower. Since the tolerance of the exposure intensity is 2%, the error is within the tolerance.

Thereafter, the proper exposure period is calculated at each point in the exposure area, and the speed of the shutter 65 in the exposure area is determined so that the shutter 65 is opened for a proper exposure period to expose the resist properly. A method of determining the speed of the shutter 65 in the exposure area when the proper exposure period for each point in the exposure area is given, and driving the shutter 65, is disclosed in Japanese Laid-Open Patent Application No. 243519/1989.

In an alternative, the exposure intensity distribution is determined at at least two accumulation current levels, and the optimum exposure period at each point in the exposure area at the accumulation current levels, and thereafter, the proper exposure period at a given accumulation current level can be determined by interpolation on the basis of the proper exposure periods at at least two exposure current levels.

Embodiment 6

FIG. 36 illustrates an X-ray exposure apparatus according to a sixth embodiment of the present invention. The SR radiation irradiated from the X-ray source in the form of an SR generator 71 is incident on a cylindrical convex spherical mirror 73 of SiC disposed at 3 m away from the point of emission with an inclined incident angle of 15 mrad approx. The mirror 73 has a convex surface in order to enlarge the SR light 76 emitted from the SR generator 71, and therefore, the curvature is away from the SR generator 78. The SR radiation 76 reflected by the mirror 13 is transmitted through a reticle in the form of a transmission type mask 79 having an X-ray transmission film on which a desired pattern is formed by an X-ray absorbing material, so that the desired pattern of the X-rays is incident on a substrate (wafer) 80 coated with resist material sensitive to the X-rays on the wafer stage 81. Upstream of the mask 79, there is disposed a shutter 77 for controlling the exposure period over the entire exposure area. The shutter 77 is driven by a shutter driving unit 78 controlled by a shutter control unit 83. In order to monitor the accumulation current, an X-ray detector 12 having a radiation receiving surface of sufficient size is disposed between the mirror 73 and the point of emission. An unshown thin film of Be having a thickness of 12 μm is disposed downstream of the mirror 73 and upstream of the shutter 77 to function as an isolation between the upstream ultra vacuum environment and the downstream pressure reduced He environment.

The radius of curvature R of the SiC mirror 73 is variable between 50 m and 57 m by a mirror shape changing unit 74 controlled by a mirror shape control unit 75. The shutter correction is carried out on the assumption that the σy and σy' of the electron beam do not change and that the exposure intensity distribution is proportional to the accumulation current as in the prior art, and the radius of curvature R is controlled so that the exposure non-uniformity is within the tolerance.

FIG. 37 shows the exposure intensity distribution at the accumulation current level of 300 mA and the radius of curvature of 56.7 m. This is indicated by the highest intensity line among the four solid lines. If it is assumed that σy and σy' do not change and that the exposure intensity distribution is proportional to the accumulation current as in the prior art, the exposure intensity distributions are as indicated by broken lines in FIG. 37 at the accumulation currents 250 mA, 200 mA and 150 mA. On the other hand, in order that the exposure intensity distribution at the accumulation current level of 150 mA is in accord with the exposure intensity distribution provided on the assumption that the exposure intensity distribution is proportional to the accumulated current without the change of σy and σy' within the tolerance in the exposure area (20 mm-width), the radius of curvature R is 51.3 m. The exposure intensity distribution at this time is indicated by the lowest level solid line in FIG. 37. Between 150 mA and 300 mA of the accumulation current, the radius of curvature is determined by linear interpolation from 51.3 m–56.7 m. The resultant exposure intensity distribution at 200 mA and 250 mA of the accumulation current is indicated by solid lines in FIG. 37. They are in accord with the exposure intensity distribution provided on the assumption that σy and σy' do not change and that the exposure intensity distribution is proportional to the accumulation current, within the tolerance in the exposure region (20 mm-width).

In this embodiment, the exposure intensity distribution is frequently measured at the accumulation current of 150 mA. A calibrated photodiode is usable as an X-ray detector 72. Generally, in an X-ray exposure apparatus using an SR generator, the X-ray intensity distribution measured by an X-ray detector 82 disposed on a wafer stage 81 is different from the exposure intensity distribution for the following reasons:

1. The spectrum of SR radiation is continuous;
2. The SR radiation is reflected by at least one mirror, and the reflectance is significantly dependent on the wavelength of the X-rays and the incident angle;
3. Transmissivities of the Be window and membrane passed by the SR radiation before reaching the resist are significantly dependent on the wavelength thereof;
4. The absorption of the X-rays by the resist is significantly dependent on the wavelength (the resist exposure is proportional to the energy absorbed thereby, and therefore, this means that the spectrum sensitivity of the resist is not uniform); and
5. The spectrum sensitivity of the X-ray detector 72 is significantly different from the spectrum sensitivity of the resist.

Therefore, the amount of exposure is different even if the X-ray intensity is the same. However, the linearity of the X-ray detector 82 is high, and the reproducibility thereof is also high. Therefore, the interrelation therebetween is determined at each position in the exposure area, and on the basis of which an exposure intensity distribution can be calculated from the X-ray intensity at a given position. The exposure operation is carried out for a predetermined period at an accumulation current, and the exposure intensity distribution is determined from the film remaining ratio. The X-ray intensity distribution is determined from the output of the X-ray detector 82, while the wafer stage 81 is being moved in the y-direction (perpendicular to the SR orbit plane) with the accumulation current level which is substantially the same during the exposure.

Figure 39:
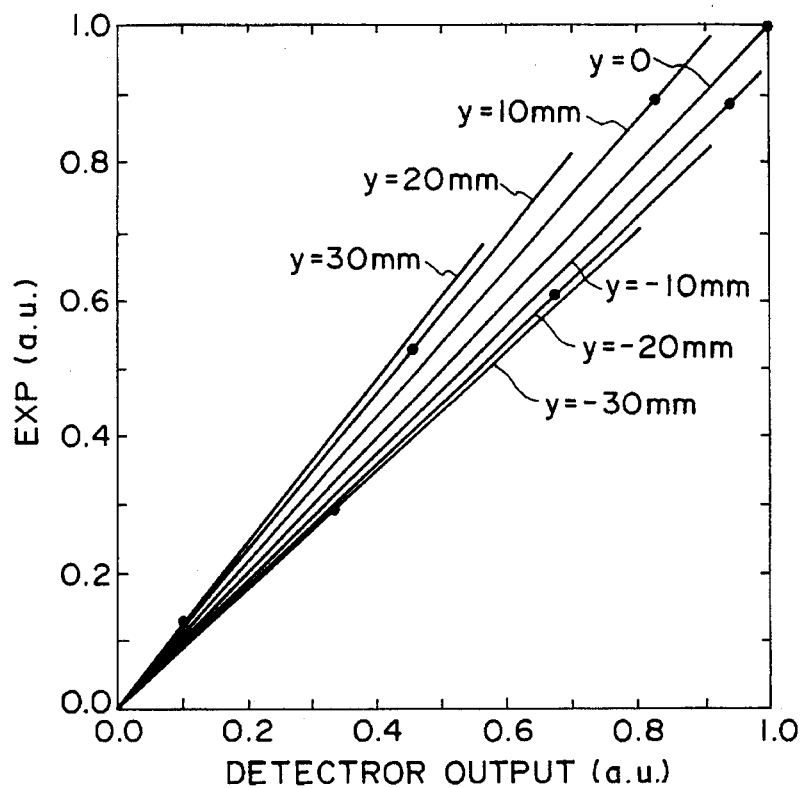
FIG. 39 is a graph of an interrelation between an exposure intensity and an X-ray intensity at each point in an exposure area.
Figure 40:
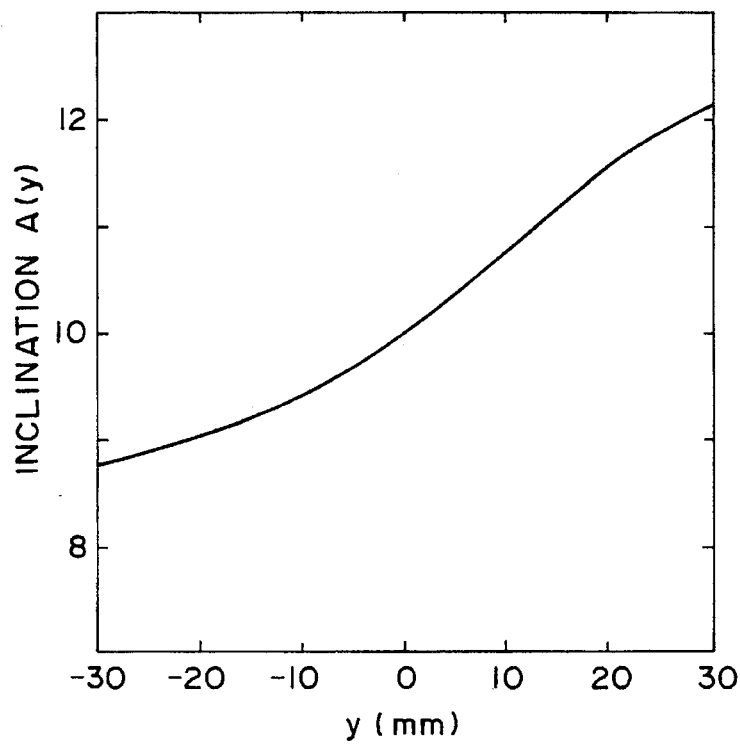
FIG. 40 is a graph of a ratio A (y) of an exposure intensity and an X-ray intensity.

FIG. 38 shows a normalized exposure intensity distribution and an X-ray intensity distribution measured by the X-ray detector 82 disposed on the wafer stage 81 when the accumulation current is 150 mA, and the radius of curvature is 51.3 m. FIG. 39 shows an interrelation between the X-ray intensity and the exposure intensity at each point in the exposure region. Since the spectrum distribution, the spectrum sensitivity of the X-ray detector 82 and the spectrum sensitivity of the resist are different at each position of the exposure area, the inclination of the interrelation at each point is different. However, the linearity is so high that the exposure amount is determined from the X-ray intensity. The exposure intensity is determined by the following equation:

$$D(y) = A(y) \times O(y) \tag{17}$$

where D (y) is the exposure intensity, and O (y) is the X-ray intensity, and A (y) is the inclination. FIG. 40 shows the inclination A (y). If another X-ray detector is used with the result of a change of A (y), it is required to determine A (y), again. As for the method of determining the exposure intensity, the exposure operation is carried out while changing the exposure period, and thereafter, the development is carried out. Then, a ratio of the line width of the mask pattern and the line width of the resist pattern is expressed as a function of the exposure period. The optimum exposure period is determined as the exposure period resulting in 1 of the ratio. In this manner, the exposure intensity can be determined.

The method of determining the accumulation current by the X-ray detector is based on the fact or assumption that the output of the X-ray detector has a sufficiently large ray receiving surface as compared with the expanded SR radiation in the direction perpendicular to the SR orbit plane. An output of an X-ray detector at an accumulation current is measured beforehand, and when the output of the X-ray detector is one half, for example, it is assumed that the accumulation current is also one half. If a photodiode is used as the X-ray detector, the linearity can be assured in the wide range, and therefore, it is preferable.

Embodiment 7

Figure 41:
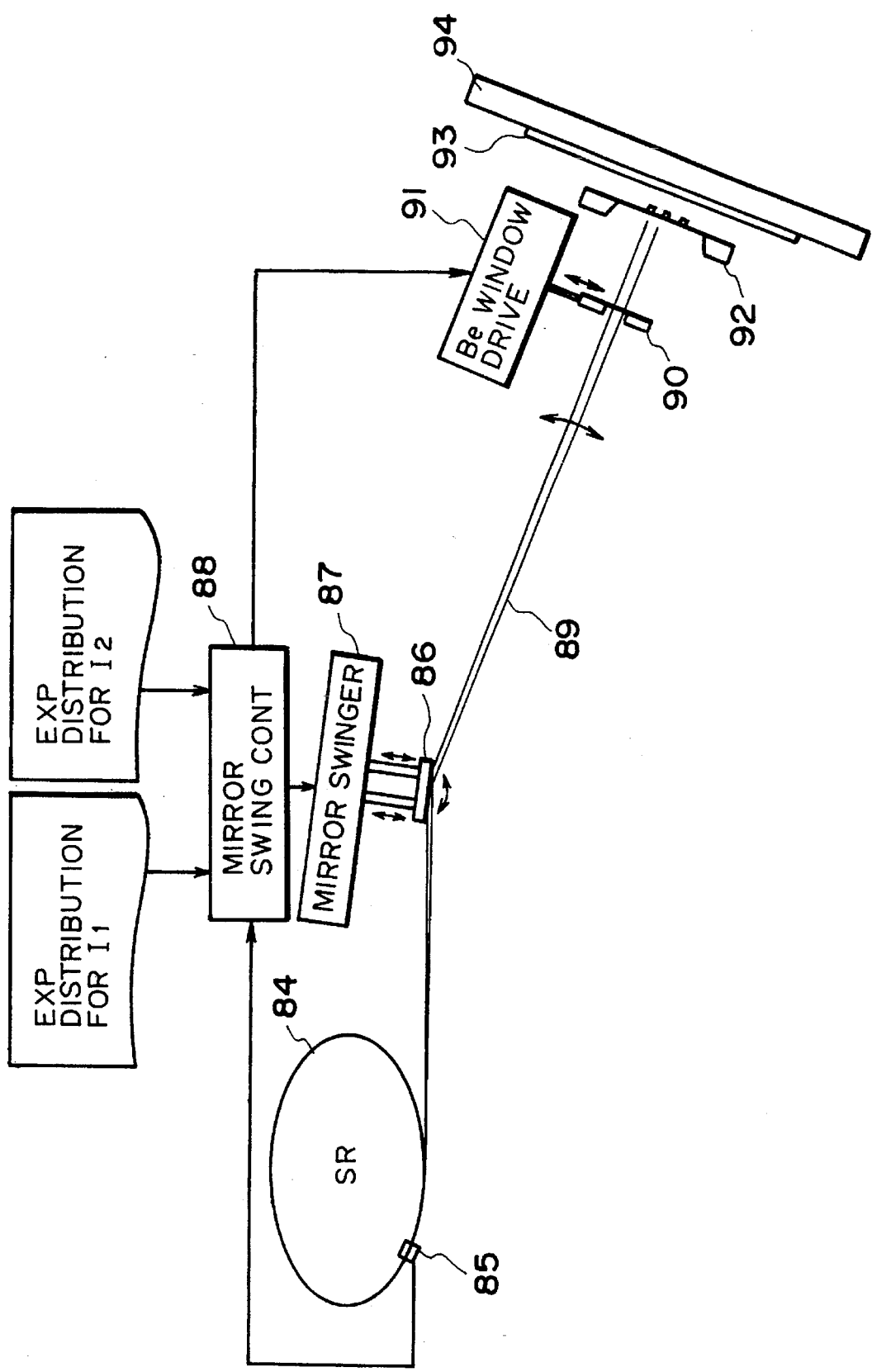
FIG. 41 illustrates an X-ray exposure apparatus according to a seventh embodiment of the present invention.

FIG. 41 illustrates an X-ray exposure apparatus according to a seventh embodiment of the present invention. The SR radiation emitted from the X-ray source in the form of an SR generator 84 is incident on a swingable flat surface mirror 86 of SiC disposed 3 m away from the point of emission at an inclined incident angle of 11–19 mrad. By the swinging motion of the mirror 86, the sheet-like SR radiation 89 is expanded in effect. The mirror 86 is swung by a mirror swinging unit 87 at a swinging speed controlled by the mirror swing control unit 88. The SR radiation 89 reflected by the mirror 86 is transmitted through a reticle in the form of a transmission type mask 92 having an X-ray transmission film on which a desired pattern is formed by an X-ray absorbing material, so that the desired pattern of the X-rays are incident on a substrate (wafer) 93 coated with resist material sensitive to the X-rays, on the wafer stage 94. At the front of the mask, there is provided an opening (Be window 90) movable in synchronism with a mirror 86. A thin film of Be having a thickness of 12 μm functions as a vacuum isolation between an upstream ultra high vacuum environment and a downstream pressure-reduced He environment. In order to assure the sufficient strength of the Be window 90 against the pressure difference, it has a thickness of 10 mm in the y-direction (perpendicular to the SR orbit plane). It is vibrated by a Be window driving unit 91 in synchronism with the vibration of the mirror 86 so as not to block the SR radiation 89. When the mirror swings, the exposure intensity is defined by the exposure amount when the sheet-like SR radiation 89 swings at a constant speed on the wafer substrate 93. In other words, the exposure intensity is determined from the remaining resist film ratio or the line width accuracy after such exposure.

Figure 42:
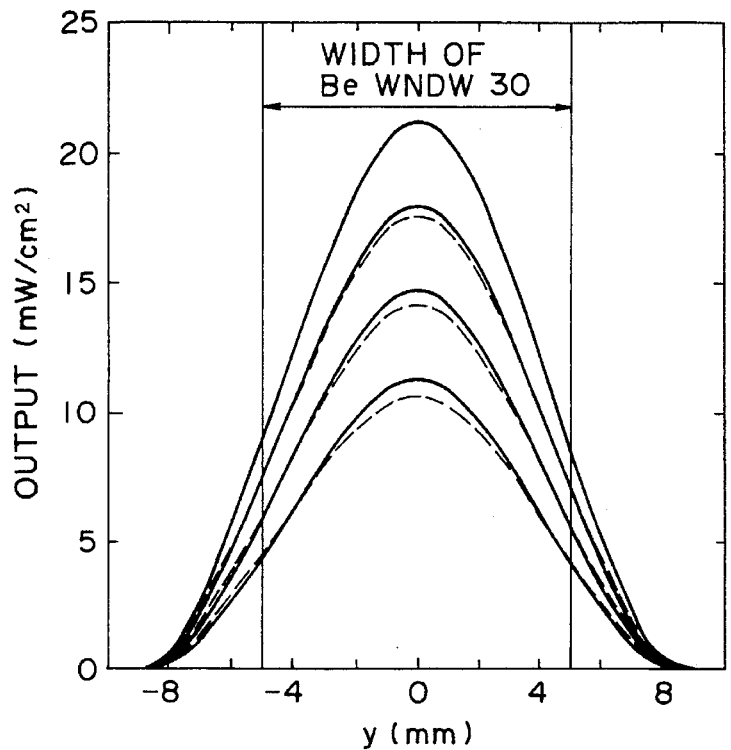
FIG. 42 is a graph of an exposure intensity distribution on a wafer by SR radiation incident on a flat mirror.

FIG. 42 shows, in a solid line, an exposure intensity distribution on the wafer substrate 93 when the mirror 86 is fixed such that the SR radiation 89 is incident on the flat mirror 86 at 12 mrad. The solid lines represent 300 mA, 250 mA, 200 mA and 150 mA of the accumulation current in the order named from the high intensity side. Through the width of the Be window 90, only the inside part of the SR radiation 89 reaches the wafer substrate 93 to expose the resist to the radiation.

Figure 43:
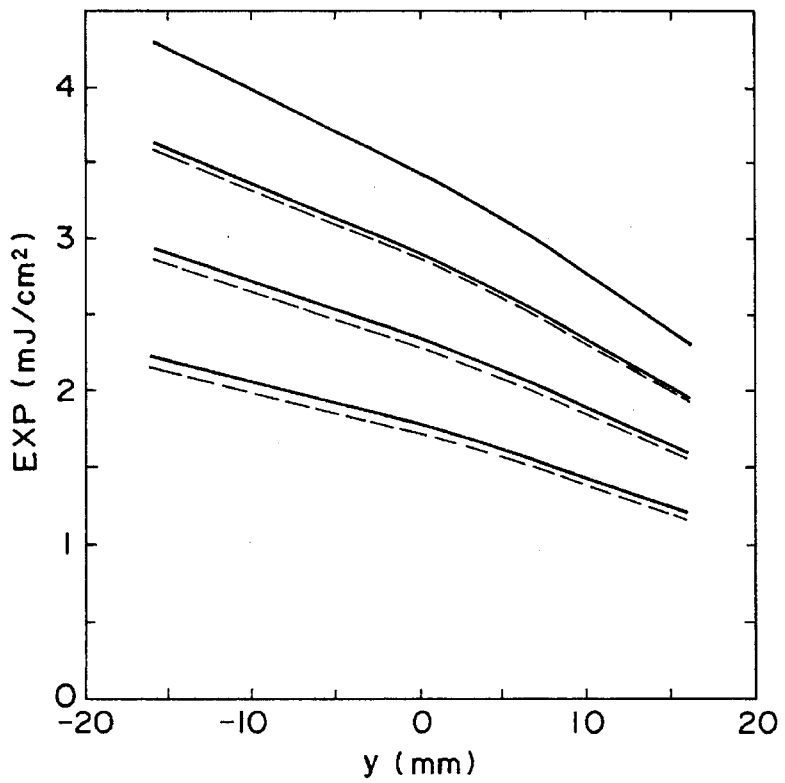
FIG. 43 is a graph of an exposure amount when the exposure is effected at a constant speed on the wafer substrate by swinging motion of a flat mirror.

In FIG. 43, solid lines show the exposure amounts provided by one vibration of the sheet like SR radiation 89 on the wafer 86 at a constant speed of 40 mm/sec. The solid lines represent 300 mA, 250 mA, 200 mA and 150 mA of the accumulation current in the order named from the larger exposure amount side. They indicate the exposure intensities for the respective accumulation currents. The exposure amount control upon the mirror swinging is effected on the basis of the following. When 6 mJ/cm$^2$ of the exposure amount is required to expose the resist having a thickness of 1 μm, for example, the SR radiation 89 swings at the speed of 40 mm/sec on the wafer substrate 93 with the accumulation current of 300 mA, and the exposure amount if 3.42 mW/cm$^2$ at y=0 mm. On the basis of this, the mirror 86 is swung to provide the speed of 22.8 (mm/sec) =40/(6/3.42) at y=0 mm.

Figure 44:
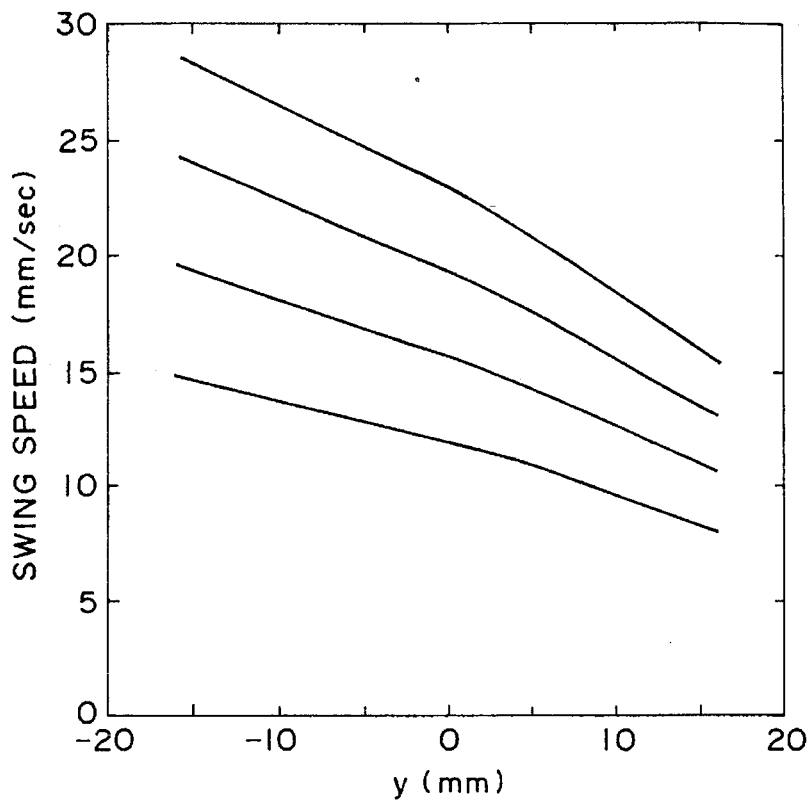
FIG. 44 is a graph of an optimum swinging speed of sheet-like SR radiation on a wafer substrate at each accumulation current.

FIG. 44 shows the proper swinging speed of the sheet-like SR radiation 89 on the wafer substrate 93 at each accumulation current. They represent 300 mA, 250 mA, 200 mA and 150 mA cases of the accumulation currents in the order named from the high speed side. In FIG. 43, the broken lines are the values provided on the assumption that the exposure amount is proportional to the accumulation current at 300 mA of the accumulation current. If it is assumed that the exposure intensity is proportional to the accumulation current, the 6% exposure non-uniformity occurs when the accumulation current is 150 mA, for example.

Figure 45:
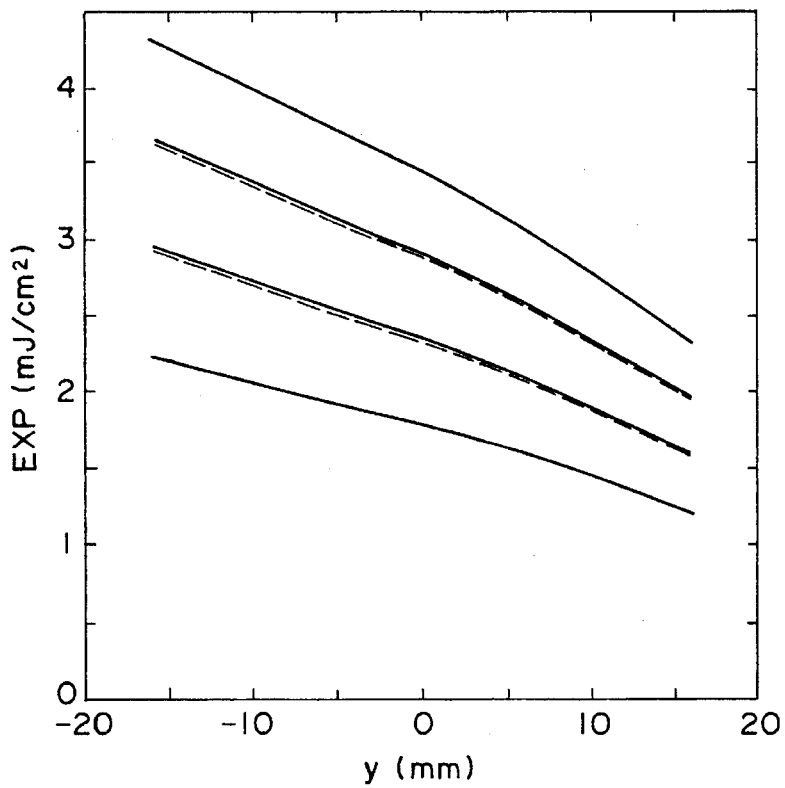
FIG. 45 is a graph of an exposure intensity of an X-ray exposure apparatus according to an eighth embodiment of the present invention.

In FIG. 45, the solid line indicates the exposure intensity (the exposure amount at a certain swinging speed of the SR radiation 89), in the similar manner as in FIG. 43. The broken lines are the exposure intensities provided by measuring the exposure amount at 150 mA and 300 mA of the accumulation currents and by determining the exposure amount intensities at 200 mA and 250 mA of the accumulation current by equation (B). The error is approx. 1%. Therefore, if the speed of the flat mirror 86 is determined on the basis of the exposure intensity distribution determined by the interpolation, the resultant exposure amount is approx. 1%.

As described in the foregoing, the exposure intensity distributions are estimated beforehand for at least two accumulation currents of the SR generator, and the dose is determined at a given position on the mask for the accumulation current during the exposure, in accordance with the estimated exposure intensity distribution and the accumulated current monitored during the exposure, by which the exposure amount non-uniformity attributable to the shape instability of the SR radiation resulting from the accumulation current can be removed.

Embodiment 8

Figure 46:
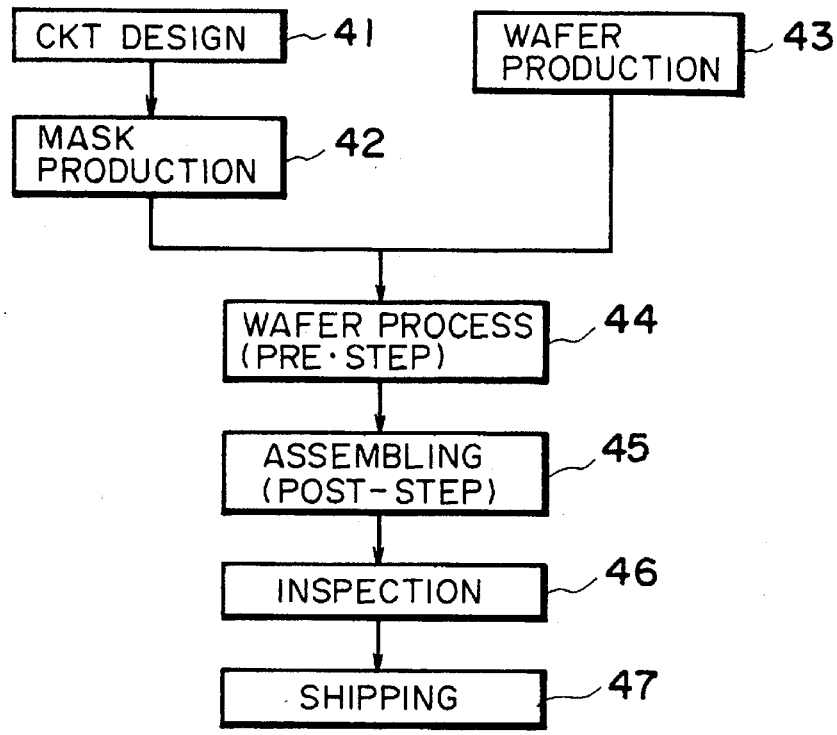
FIG. 46 is a flow chart of a device manufacturing process according to the eighth embodiment of the present invention.

The description will be made as to an embodiment of a device manufacturing method using the exposure apparatus described in the foregoing. FIG. 46 is a flow chart of a manufacturing process of fine devices such as a semiconductor chip such as IC, LSI or the like, a liquid crystal panel, CCD, thin film magnetic head, micromachine or the like. In step 41 (circuit design), the circuit of the device is designed. At step 42 (mask manufacturing), a mask having a circuit pattern of the designed circuit is manufactured. On the other hand, at step 43 (wafer manufacturing), a wafer is manufactured using a proper material such as silicon or the like. At step 44, (wafer process), a pre-process is carried out in which the circuit is printed on the wafer through a lithographic process using the prepared mask and the wafer. At step 45 (assembling), a post-process is carried out in which a semiconductor chip is manufactured using the wafer produced at step 44. It includes an assembling step (dicing, bonding), packaging step (chip sealing) or the like. At step 46 (inspection), the operation of the device manufactured by step 45 is inspected, and durability thereof is inspected. The device is manufactured through such steps, and is delivered at step 47.

Figure 47:
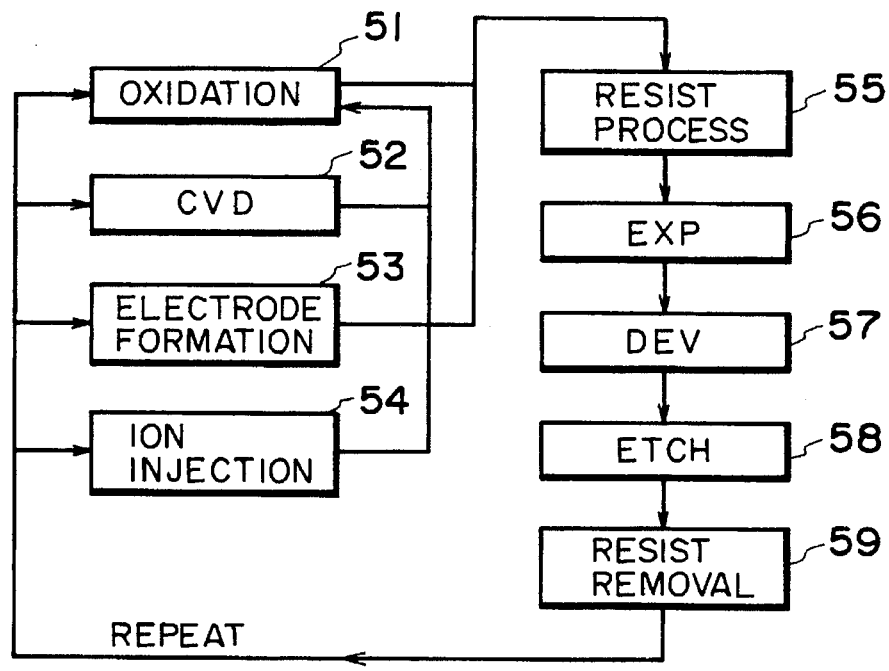
FIG. 47 is a detailed flow chart of wafer processing.

FIG. 47 is a flow chart of wafer processing described above. At step 51 (oxidation), the surface of the wafer is oxidized, and at step 52 (CVD) an insulating film is formed on the surface of the wafer. At step 53 (electrode formation), an electrode is evaporated on the wafer. At step 54 (ion implantation), the ions are implanted into the wafer. At step 55 (resist processing), the wafer is coated with sensitive material. At step 56 (exposure), the circuit pattern is printed on the wafer by any one of the exposure apparatuses described hereinbefore. At step 57 (development), the exposed wafer is developed. At step 58 (etching), the part other than the resist image is removed. At step 59 (resist removal), the unnecessary resist material after the etching is removed. These steps are repeatedly carried out to an overlaid circuit pattern on the wafer. Through the manufacturing method of this embodiment, a high accuracy device which has been difficult to manufacture can be manufactured with high productivity.

While the invention has been described with reference to the structures disclosed herein, it is not confined to the details set forth and this application is intended to cover such modifications or changes as may come within the purposes of the improvements or the scope of the following claims.

What is claimed is:

1. An exposure method for transferring a pattern onto a substrate using synchrotron radiation, said method comprising:

directly measuring a luminous intensity distribution of the synchrotron radiation, by a radiation detector, at least in a predetermined area where the pattern is to be transferred;

determining a relationship between the luminous intensity distribution of the synchrotron radiation and an exposure amount distribution absorbed by the substrate, at least in the predetermined area where the pattern is to be transferred; and effecting an exposure operation while controlling a dose amount for respective positions in the predetermined area using the determined relationship.

2. A method according to claim 1, wherein the dose amount is controlled by changing a driving profile of a movable shutter for controlling the exposure operation.

3. A method according to claim 1, wherein the synchrotron radiation intensity distribution is detected upon the exposure operation, and the dose amount is also controlled on the basis of the detection of the synchrotron radiation intensity distribution.

4. A method according to claim 1, wherein an accumulation current of the source of the synchrotron radiation is detected upon the exposure operation, and the dose amount is also controlled on the basis of the detected accumulation current.

5. A method according to claim 1, wherein the exposure amount distribution is determined on the basis of a remaining film ratio of a resist material on a substrate in a test exposure operation.

6. A method according to claim 1, wherein the relationship is in the form of a proportional coefficient between the radiation intensity and the exposure amount as a function of position information in the predetermined area.

7. A method according to claim 1, wherein the position information includes coordinate information in the predetermined area.

8. A method according to claim 6, wherein the position information includes information relating to deviation from a predetermined position in the predetermined area.

9. An exposure method for transferring a pattern onto a substrate using synchrotron radiation, said method comprising:

determining relationships between at least two accumulation currents of the source of the synchrotron radiation and an exposure amount distribution absorbed by the substrate, at least in a predetermined area where the pattern is to be transferred; and controlling a dose amount of the synchrotron radiation for respective positions in the predetermined area on the basis of the relationship and an accumulation current detected during an exposure operation.

10. An exposure apparatus for transferring a pattern onto a substrate using synchrotron radiation, said apparatus comprising:

radiation detecting means for directly measuring a luminous intensity distribution of the synchrotron radiation, at least in a predetermined area where the pattern is to be transferred;

means for determining a relationship between the luminous intensity distribution of the synchrotron radiation and an exposure amount distribution absorbed by the substrate, at least in the predetermined area where the pattern is to be transferred; and means for effecting an exposure operation while controlling a dose amount for respective positions in the predetermined area using the determined relationship.

11. An exposure apparatus for transferring a pattern onto a substrate using synchrotron radiation, said apparatus comprising:

means for determining relationships between at least two accumulation currents of the source of the synchrotron radiation and an exposure amount distribution absorbed by the substrate, at least in a predetermined area where the pattern is to be transferred; and means for controlling a dose amount of the synchrotron radiation for respective positions in the predetermined area on the basis of the relationship and an accumulation current detected during an exposure operation.

* * * * *

UNITED STATES PATENT AND TRADEMARK OFFICE
CERTIFICATE OF CORRECTION

PATENT NO. : 5,606,586
DATED : February 25, 1997
INVENTOR(S) : MITSUAKI AMEMIYA, ET AL.

It is certified that error appears in the above-indentified patent and that said Letters Patent is hereby corrected as shown below:

ON THE COVER PAGE:

At [56] References Cited

Under "FOREIGN PATENT DOCUMENTS"

"01243519  9/1989  Japan
 05129188  5/1993  Japan" should read

--1-243519  9/1989  Japan
  5-129188  5/1993  Japan--.

IN THE DRAWINGS:

Figure 39, "DETECTROR" should read --DETECTOR--.

COLUMN 4

Line 5, "varies" should read --vary--.

UNITED STATES PATENT AND TRADEMARK OFFICE
CERTIFICATE OF CORRECTION

PATENT NO. : 5,606,586

DATED : February 25, 1997

INVENTOR(S) : MITSUAKI AMEMIYA, ET AL.

It is certified that error appears in the above-indentified patent and that said Letters Patent is hereby corrected as shown below:

<u>COLUMN 7</u>

Line 13, "ay" should read --$\Delta y$--.

<u>COLUMN 10</u>

Line 56, "D0(y)," should read --D0(y),--.

<u>COLUMN 21</u>

Line 20, "exposure" should read --predetermined--.

Signed and Sealed this

Twenty-sixth Day of August, 1997

Attest:

BRUCE LEHMAN

Attesting Officer

Commissioner of Patents and Trademarks